(12) United States Patent
Inoue et al.

(10) Patent No.: US 11,417,495 B2
(45) Date of Patent: Aug. 16, 2022

(54) MULTI-CHARGED PARTICLE BEAM IRRADIATION APPARATUS AND MULTI-CHARGED PARTICLE BEAM INSPECTION APPARATUS

(71) Applicant: NuFlare Technology, Inc., Yokohama (JP)

(72) Inventors: Kazuhiko Inoue, Yokohama (JP); Masataka Shiratsuchi, Yokohama (JP); Munehiro Ogasawara, Hiratsuka (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 17/194,544

(22) Filed: Mar. 8, 2021

(65) Prior Publication Data
US 2021/0319974 A1    Oct. 14, 2021

(30) Foreign Application Priority Data

Apr. 13, 2020 (JP) .............................. JP2020-071726

(51) Int. Cl.
| | | |
|---|---|---|
| *H01J 37/147* | (2006.01) | |
| *H01J 37/153* | (2006.01) | |
| *H01J 37/244* | (2006.01) | |
| *H01J 37/28* | (2006.01) | |

(52) U.S. Cl.
CPC ........ *H01J 37/1477* (2013.01); *H01J 37/153* (2013.01); *H01J 37/244* (2013.01); *H01J 37/28* (2013.01); *H01J 2237/1516* (2013.01); *H01J 2237/1518* (2013.01); *H01J 2237/1532* (2013.01); *H01J 2237/2448* (2013.01)

(58) Field of Classification Search
CPC .... H01J 37/1477; H01J 37/153; H01J 37/244; H01J 37/28; H01J 2237/1516; H01J 2237/1518; H01J 2237/1532; H01J 2237/2448; H01J 37/147; H01J 37/3174; G01N 23/2251
See application file for complete search history.

(56) References Cited

U.S. PATENT DOCUMENTS

| | | | | |
|---|---|---|---|---|
| 7,060,984 | B2 * | 6/2006 | Nagae | H01J 37/023 430/296 |
| 10,347,460 | B2 * | 7/2019 | Zhao | H01J 37/222 |
| 2002/0160311 | A1 * | 10/2002 | Muraki | H01J 37/3177 430/296 |

(Continued)

FOREIGN PATENT DOCUMENTS

JP        2006-80276 A      3/2006

*Primary Examiner* — David A Vanore
(74) *Attorney, Agent, or Firm* — Oblon, McClelland, Maier & Neustadt, L.L.P.

(57) ABSTRACT

A multi-charged particle beam irradiation apparatus includes a forming mechanism to form multiple charged particle beams, a multipole deflector array to individually deflect each beam of the multiple charged particle beams so that a center axis trajectory of each beam of the multiple charged particle beams may not converge in a region of the same plane orthogonal to the direction of a central axis of a trajectory of the multiple charged particle beams, and an electron optical system to irradiate a substrate with the multiple charged particle beams while maintaining a state where the multiple charged particle beams are not converged.

14 Claims, 17 Drawing Sheets

(56) References Cited

U.S. PATENT DOCUMENTS

| | | | | |
|---|---|---|---|---|
| 2003/0122087 A1* | 7/2003 | Muraki | ............... | B82Y 40/00 |
| | | | | 250/398 |
| 2004/0188636 A1* | 9/2004 | Hosoda | ............... | B82Y 10/00 |
| | | | | 250/398 |
| 2005/0006603 A1* | 1/2005 | Muraki | ............... | H01J 37/3177 |
| | | | | 250/492.23 |
| 2005/0072941 A1* | 4/2005 | Tanimoto | ............... | B82Y 40/00 |
| | | | | 250/492.23 |
| 2005/0077475 A1* | 4/2005 | Nagae | ............... | H01J 37/12 |
| | | | | 250/396 R |
| 2013/0216954 A1* | 8/2013 | Oishi | ............... | H01J 37/3177 |
| | | | | 430/296 |
| 2014/0346349 A1* | 11/2014 | Nishimura | ............... | H01J 37/3177 |
| | | | | 250/311 |
| 2018/0254167 A1* | 9/2018 | Zhao | ............... | H01J 37/222 |

\* cited by examiner

Amount of Space/Distance between Beams in XO Plane = 0

Amount of Space/Distance between Beams in XO Plane = 0.4

Amount of Space/Distance between Beams in XO Plane = 1.0

MULTI-CHARGED PARTICLE BEAM IRRADIATION APPARATUS AND MULTI-CHARGED PARTICLE BEAM INSPECTION APPARATUS

CROSS-REFERENCE TO RELATED APPLICATION

This application is based upon and claims the benefit of priority from prior Japanese Patent Application No. 2020-071726 filed on Apr. 13, 2020 in Japan, the entire contents of which are incorporated herein by reference.

BACKGROUND OF THE INVENTION

Field of the Invention

Embodiments of the present invention relate to a multi-charged particle beam irradiation apparatus and a multi-charged particle beam inspection apparatus, and, for example, to a method for irradiating a substrate with multiple electron beams.

Description of Related Art

With recent progress in high integration and large capacity of the LSI (Large Scale Integrated circuits), the line width (critical dimension) required for circuits of semiconductor elements is becoming increasingly narrower. Since LSI manufacturing requires an enormous production cost, it is essential to improve the yield. Meanwhile, as typified by 1 gigabit DRAMs (Dynamic Random Access Memories), the size of patterns which make up LSI is reduced from the order of submicrons to nanometers. Also, in recent years, with miniaturization of dimensions of LSI patterns formed on a semiconductor wafer, dimensions to be detected as a pattern defect have become extremely small. Therefore, the pattern inspection apparatus for inspecting defects of ultrafine patterns exposed/transferred onto a semiconductor wafer needs to be highly accurate.

As an inspection method, there is known a method of comparing a measured image acquired by imaging a pattern formed on a substrate, such as a semiconductor wafer or a lithography mask, with design data or with another measured image acquired by imaging the same pattern on the substrate. For example, as a pattern inspection method, there are "die-to-die inspection" and "die-to-database inspection". The "die-to-die inspection" method compares data of measured images acquired by imaging the same patterns at different positions on the same substrate. The "die-to-database inspection" method generates, based on pattern design data, design image data (reference image), and compares it with a measured image being measured data acquired by imaging a pattern. Acquired images are transmitted as measured data to a comparison circuit. After performing alignment between the images, the comparison circuit compares the measured data with reference data according to an appropriate algorithm, and determines that there is a pattern defect if the compared data do not match each other.

In defect inspection of semiconductor wafers and photo-masks, it is required to detect smaller size defects. Therefore, with respect to recent inspection apparatuses, specifically the pattern inspection apparatus described above, in addition to the type of apparatus that irradiates an inspection substrate with laser beams to obtain a transmission image or a reflection image of a pattern formed on the substrate, there has been developed another type of inspection apparatus that acquires a pattern image by scanning the inspection substrate with electron beams whose wavelength is shorter than that of laser lights, and detecting secondary electrons emitted from the inspection substrate due to the irradiation with the electron beams. Further, with regards to the inspection apparatuses using electron beams, those using multiple beams have also been under development.

With respect to a multi-beam inspection apparatus, it is required to reduce the diameter of each beam and to increase the total amount of current for realizing high resolution and high throughput. However, with the increase in the total amount of current of multiple beams, the Coulomb effect also increases, resulting in blurring of the beams. Thereby, the beam diameter on the substrate becomes large. Thus, for realizing high resolution and high throughput, it is necessary to reduce the Coulomb effect which affects multiple beams. This problem is not limited to the inspection apparatus, and it may similarly happen in the apparatuses which perform irradiation with multiple beams, such as a writing apparatus using multiple beams.

Although not correcting for reducing the Coulomb effect, there is disclosed a writing apparatus in which a multi-aligner that individually applies alignment deflection to multiple beams is arranged so that spherical aberration may be corrected (e.g., refer to Japanese Patent Application Laid-open (JP-A) No. 2006-080276).

BRIEF SUMMARY OF THE INVENTION

According to one aspect of the present invention, a multi-charged particle beam irradiation apparatus includes a forming mechanism configured to form multiple charged particle beams, a multipole deflector array configured to individually deflect each beam of the multiple charged particle beams so that a center axis trajectory of the each beam of the multiple charged particle beams does not converge in a region of a same plane orthogonal to a direction of a central axis of a trajectory of the multiple charged particle beams, and an electron optical system configured to irradiate a substrate with the multiple charged particle beams while maintaining a state where the multiple charged particle beams are not converged.

According to another aspect of the present invention, a multi-charged particle beam inspection apparatus includes a forming mechanism configured to form multiple charged particle beams, a multipole deflector array configured to individually deflect each beam of the multiple charged particle beams so that a center axis trajectory of the each beam of the multiple charged particle beams does not converge in a region of a same plane orthogonal to a direction of a central axis of a trajectory of the multiple charged particle beams, an electron optical system configured to irradiate a substrate with the multiple charged particle beams while maintaining a state where the multiple charged particle beams are not converged, a multi-detector configured to detect multiple secondary electron beams emitted from the substrate due to irradiation with the multiple charged particle beams, and an inspection circuit configured to inspect a secondary electron image based on detected multiple secondary electron beams.

DETAILED DESCRIPTION OF THE INVENTION

Embodiments below describe an irradiation apparatus and an inspection apparatus that can reduce the Coulomb effect acting on multiple beams.

Embodiments below use an electron beam as an example of a charged particle beam. However, it is not limited thereto, and other charged particle beams such as an ion beam may also be used. Moreover, Embodiments below describe an inspection apparatus using multiple beams as an example of a multi-beam irradiation apparatus. However, it is not limited thereto. For example, it may be a writing apparatus using multiple beams. Alternatively, it may be an image acquisition apparatus using multiple beams.

First Embodiment

Figure 1:
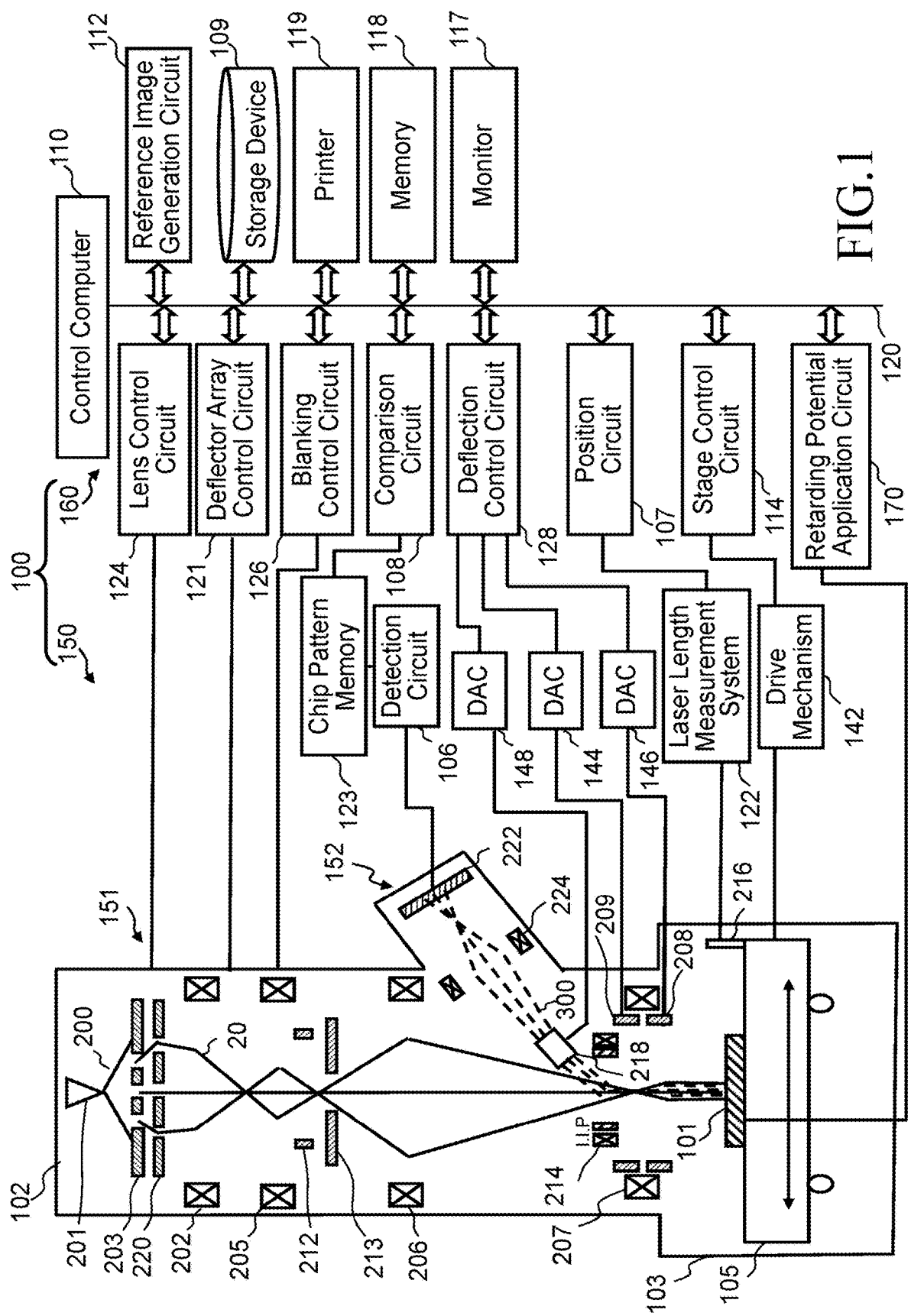
FIG. 1 shows a configuration of an inspection apparatus according to a first embodiment.

FIG. 1 shows a configuration of an inspection apparatus according to a first embodiment. In FIG. 1, an inspection apparatus 100 for inspecting a pattern formed on the substrate is an example of a multi-electron beam inspection apparatus. The inspection apparatus 100 includes an image acquisition mechanism 150 and a control system circuit 160. The image acquisition mechanism 150 includes an electron beam column 102 (electron optical column) and an inspection chamber 103. In the electron beam column 102, there are disposed an electron gun 201, a shaping aperture array substrate 203, a multipole deflector array 220, an electromagnetic lens 202, an electromagnetic lens 205, a common blanking deflector 212, a limiting aperture substrate 213, an electromagnetic lens 206, an electromagnetic lens 207 (objective lens), a main deflector 208, a sub deflector 209, a beam separator 214, a deflector 218, an electromagnetic lens 224, and a multi-detector 222. A primary electron optical system 151 is composed of the electron gun 201, the shaping aperture array substrate 203, the multipole deflector array 220, the electromagnetic lens 202, the electromagnetic lens 205, the common blanking deflector 212, the limiting aperture substrate 213, the electromagnetic lens 206, the electromagnetic lens 207 (objective lens), the main deflector 208, and the sub deflector 209. A secondary electron optical system 152 is composed of the electromagnetic lens 207, the beam separator 214, the deflector 218, and the electromagnetic lens 224.

In the inspection chamber 103, a stage 105 movable at least in the x and y directions is disposed. A substrate 101 (target object) to be inspected is mounted on the stage 105. The substrate 101 is placed on an electrostatic chuck mechanism 234 on the stage 105, and the backside of the substrate is absorbed by the electrostatic chuck. The substrate 101 may be an exposure mask substrate, or a semiconductor substrate such as a silicon wafer. In the case of the substrate 101 being a semiconductor substrate, a plurality of chips (wafer dies) is formed on the semiconductor substrate. In the case of the substrate 101 being an exposure mask substrate, a chip pattern is formed on the exposure mask substrate. The chip pattern is composed of a plurality of figure patterns. When the chip pattern formed on the exposure mask substrate is exposed/transferred onto the semiconductor substrate a plurality of times, a plurality of chip patterns (wafer dies) is formed on the semiconductor substrate. The case of the substrate 101 being a semiconductor substrate is described below mainly. The substrate 101 is placed with its pattern-forming surface facing upward on the stage 105, for example. On the stage 105, there is disposed a mirror 216 which reflects a laser beam for measuring a laser length emitted from a laser length measuring system 122 arranged outside the inspection chamber 103.

The multi-detector 222 is connected, at the outside of the electron beam column 102, to a detection circuit 106. The detection circuit 106 is connected to a chip pattern memory 123.

In the control system circuit 160, a control computer 110 which controls the whole of the inspection apparatus 100 is connected, through a bus 120, to a position circuit 107, a comparison circuit 108, a reference image generation circuit 112, a stage control circuit 114, a deflector array control circuit 121, a lens control circuit 124, a blanking control circuit 126, a deflection control circuit 128, a retarding potential application circuit 170, a storage device 109 such as a magnetic disk drive, a monitor 117, a memory 118, and a printer 119. The deflection control circuit 128 is connected to DAC (digital-to-analog conversion) amplifiers 144, 146 and 148. The DAC amplifier 146 is connected to the main deflector 208, and the DAC amplifier 144 is connected to the sub deflector 209. The DAC amplifier 148 is connected to the deflector 218.

The substrate 101 is electrically connected to the retarding potential application circuit 170. The retarding potential application circuit 170 applies a negative retarding potential Vr to the substrate 101.

The chip pattern memory 123 is connected to the comparison circuit 108. The stage 105 is driven by a drive mechanism 142 under the control of the stage control circuit 114. In the drive mechanism 142, a drive system such as a three (x-, y-, and θ-) axis motor which provides drive in the directions of x, y, and θ in the stage coordinate system is configured, and therefore, the stage 105 can move in the x, y, and θ directions. A step motor, for example, can be used as each of these x, y, and θ motors (not shown). The stage 105 is movable in the horizontal direction and the rotation direction by the x-, y-, and θ-axis motors. The movement position of the stage 105 is measured by the laser length measuring system 122, and supplied (transmitted) to the position circuit 107. Based on the principle of laser interferometry, the laser length measuring system 122 measures the position of the stage 105 by receiving a reflected light from the mirror 216. In the stage coordinate system, the x, y, and θ directions are set with respect to a plane perpendicular to the optical axis of multiple primary electron beams 20, for example.

The electromagnetic lenses 202, 205, 206, 207 (objective lens), and 224, and the beam separator 214 are controlled by the lens control circuit 124. The common blanking deflector 212 is configured by two or more electrodes (or "two or more poles"), and each electrode is controlled by the blanking control circuit 126 through a DAC amplifier (not shown). The sub deflector 209 is configured by four or more electrodes (or "four or more poles"), and each electrode is controlled by the deflection control circuit 128 through the DAC amplifier 144. The main deflector 208 is configured by four or more electrodes (or "four or more poles"), and each electrode is controlled by the deflection control circuit 128 through the DAC amplifier 146. The deflector 218 is configured by four or more electrodes (or "four or more poles"), and each electrode is controlled by the deflection control circuit 128 through the DAC amplifier 148. Each multipole deflector of the multipole deflector array 220 is individually controlled by the deflector array control circuit 121.

A high voltage power supply circuit (not shown) is connected to the electron gun 201. The high voltage power supply circuit applies an acceleration voltage between a filament (cathode) and an extraction electrode (anode) (which are not shown) in the electron gun 201. In addition to the applied acceleration voltage, a voltage is applied to another extraction electrode (Wehnelt), and the cathode is heated to a predetermined temperature, and thereby, electrons from the cathode are accelerated and emitted as an electron beam 200.

FIG. 1 shows configuration elements necessary for describing the first embodiment. It should be understood that other configuration elements generally necessary for the inspection apparatus 100 may also be included therein.

Figure 2:
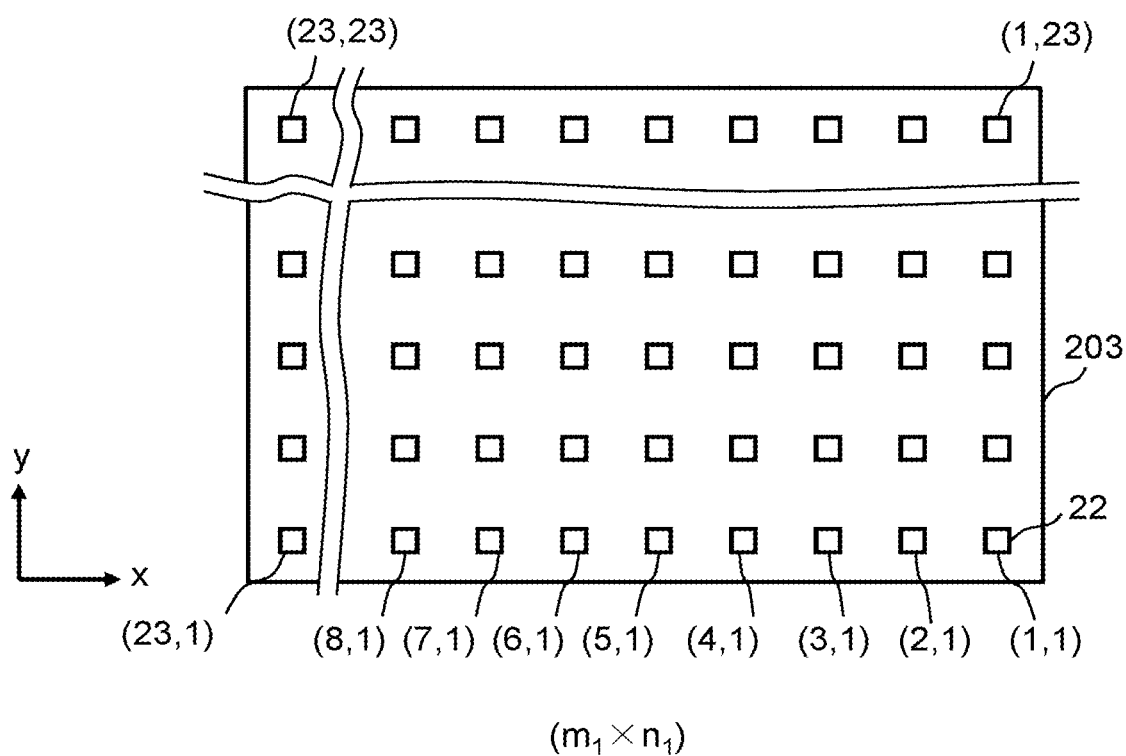
FIG. 2 is a conceptual diagram showing a configuration of a shaping aperture array substrate according to the first embodiment.

FIG. 2 is a conceptual diagram showing a configuration of a shaping aperture array substrate according to the first embodiment. As shown in FIG. 2, holes (openings) 22 of $m_1$ columns wide (width in the x direction) (each column in the y direction) and $n_1$ rows long (length in the y direction) (each row in the x direction) are two-dimensionally formed in the x and y directions at a predetermined arrangement pitch in the shaping aperture array substrate 203, where each of $m_1$ and $n_1$ is an integer of 2 or more. In the case of FIG. 2, 23×23 holes (openings) 22 are formed. Each of the holes 22 is a rectangle (including a square) having the same dimension, shape, and size. Alternatively, each of the holes 22 may be a circle with the same outer diameter.

The electron beam 200 emitted from the electron gun 201 (emission source) illuminates the whole of the shaping aperture array substrate 203. As shown in FIG. 2, a plurality of holes 22 (openings) are formed in the shaping aperture array substrate 203. The region including all the plurality of holes 22 is irradiated by the electron beam 200. The multiple primary electron beams 20 are formed by letting portions of the electron beam 200, which irradiate the positions of the plurality of holes 22, individually pass through a corresponding one of the plurality of holes 22 in the shaping aperture array substrate 203 (forming mechanism). The formed multiple primary electron beams 20 travel to the multipole deflector array 220.

Figure 3A:
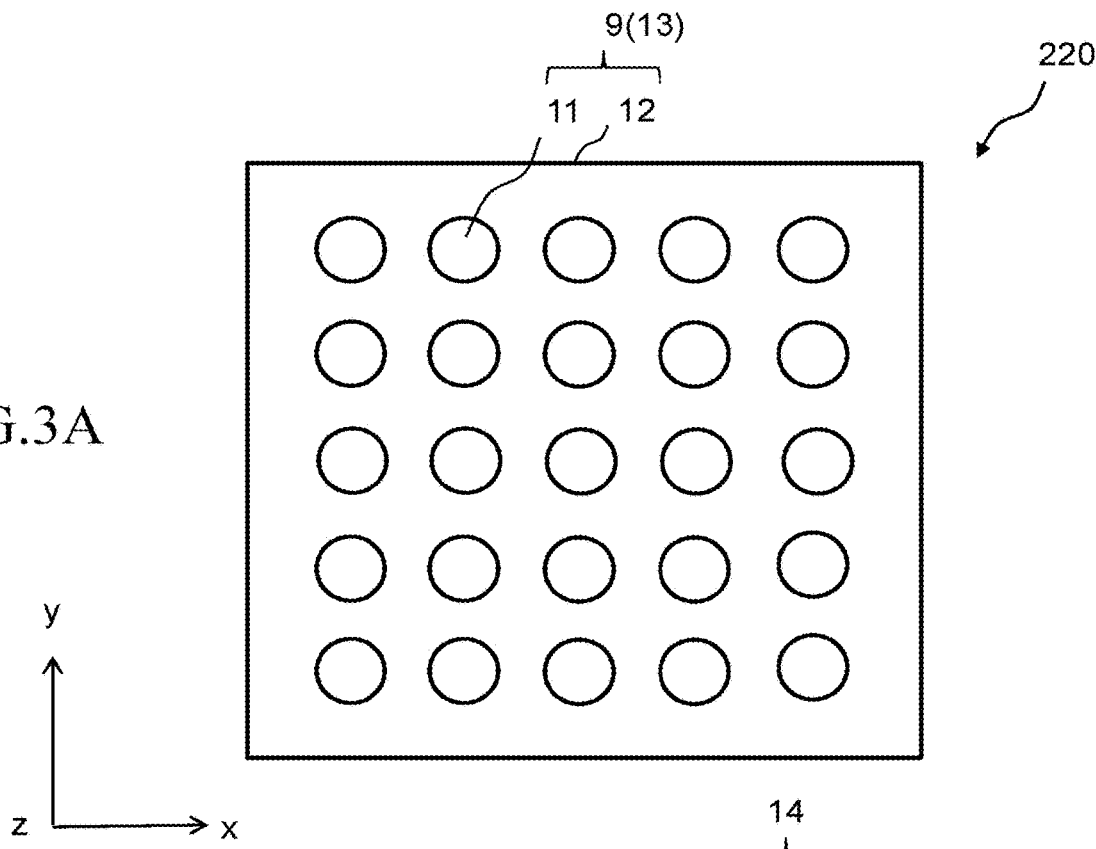
FIGS. 3A and 3B are diagrams each illustrating a configuration of a multipole deflector array according to the first embodiment.
Figure 3B:
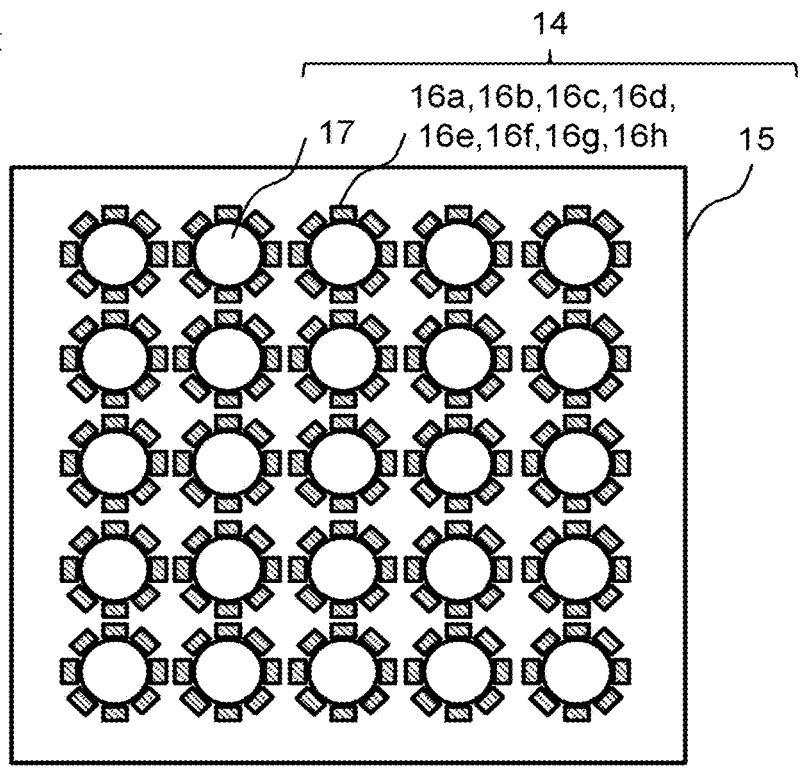

FIGS. 3A and 3B are diagrams each illustrating a configuration of a multipole deflector array according to the first embodiment. In the examples of FIGS. 3A and 3B, the multiple primary electron beams 20 of 5×5 (rows by columns) are used, for example. The multipole deflector array 220 includes two electrode substrates 9 and 14, in this order arranged upper and lower, having a space therebetween, or three electrode substrates 9, 14, and 13, in this order arranged upper, middle, and lower, having a space therebetween. The electrode substrates 9 and 13 may have the same structure. In FIG. 3A, a plurality of passage holes 11 through which the multiple primary electron beams 20 pass are formed in a substrate body 12 of each of the electrode substrates 9 and 13. At least the whole exposed surface of the substrate body 12 is made of a conductive material. For example, the substrate body 12 is made of a conductive material, such as metal. Alternatively, it is also preferable that the whole exposed surface of the substrate body 12 made of an insulating material is coated with a conductive film. For example, a ground potential is applied to the substrate body 12. In FIG. 3B, in the electrode substrate 14, a plurality of passage holes 17 through which the multiple primary electron beams 20 pass and whose hole diameter size is the same as that of the electrode substrates 9 and 13 are formed in a substrate body 15. Preferably, the substrate body 15 is made of silicon (Si) material, for example. Then, on the substrate body 15, a plurality of electrodes 16 (16a to 16h) serving as multipoles each surrounding the passage hole 17 are arranged. The plurality of electrodes 16, each of which surrounds the passage hole 17, are arranged on an insulating layer so that they may not electrically conduct with each other. The plurality of electrodes 16 configuring multipoles are composed of four or more electrodes/poles. For example, it is preferable to use eight electrodes/poles. A potential is applied to each of the plurality of electrodes 16 for each beam of the multiple primary electron beams 20. By controlling a potential of each beam, applied to each of the plurality of electrodes 16, it becomes possible to individually perform deflection in an optional direction and of an optional amount. In other words, the beam trajectory can be changed for each beam.

The multiple primary electron beams 20 having passed through the multipole deflector array 220, while being individually refracted by the electromagnetic lenses 202, 205 and 206, travel to the electromagnetic lens 207 (objective lens) through the beam separator 214 arranged on the intermediate image plane IIP (position conjugate to the image plane) of each beam of the multiple primary electron beams 20.

When the multiple primary electron beams 20 are incident on the electromagnetic lens 207 (objective lens), the electromagnetic lens 207 focuses the multiple primary electron beams 20 onto the substrate 101. The multiple primary electron beams 20 having been focused on the substrate 101 (target object) by the objective lens 207 are collectively deflected by the main deflector 208 and the sub deflector 209 so as to irradiate respective beam irradiation positions on the substrate 101. When all of the multiple primary electron beams 20 are collectively deflected by the common blanking deflector 212, they deviate from the hole in the center of the limiting aperture substrate 213 and are blocked by the limiting aperture substrate 213. On the other hand, the multiple primary electron beams 20 which were not deflected by the common blanking deflector 212 pass through the hole in the center of the limiting aperture substrate 213 as shown in FIG. 1. Blanking control is provided by On/Off of the common blanking deflector 212 to collectively control On/Off of the multiple beams. Thus, the limiting aperture substrate 213 blocks the multiple primary electron beams 20 which were deflected to be in the "Off condition" by the common blanking deflector 212. Then, the multiple primary electron beams 20 for image acquisition are formed by beams having been made during a period from becoming "beam On" to becoming "beam Off" and having passed through the limiting aperture substrate 213.

Figure 4:
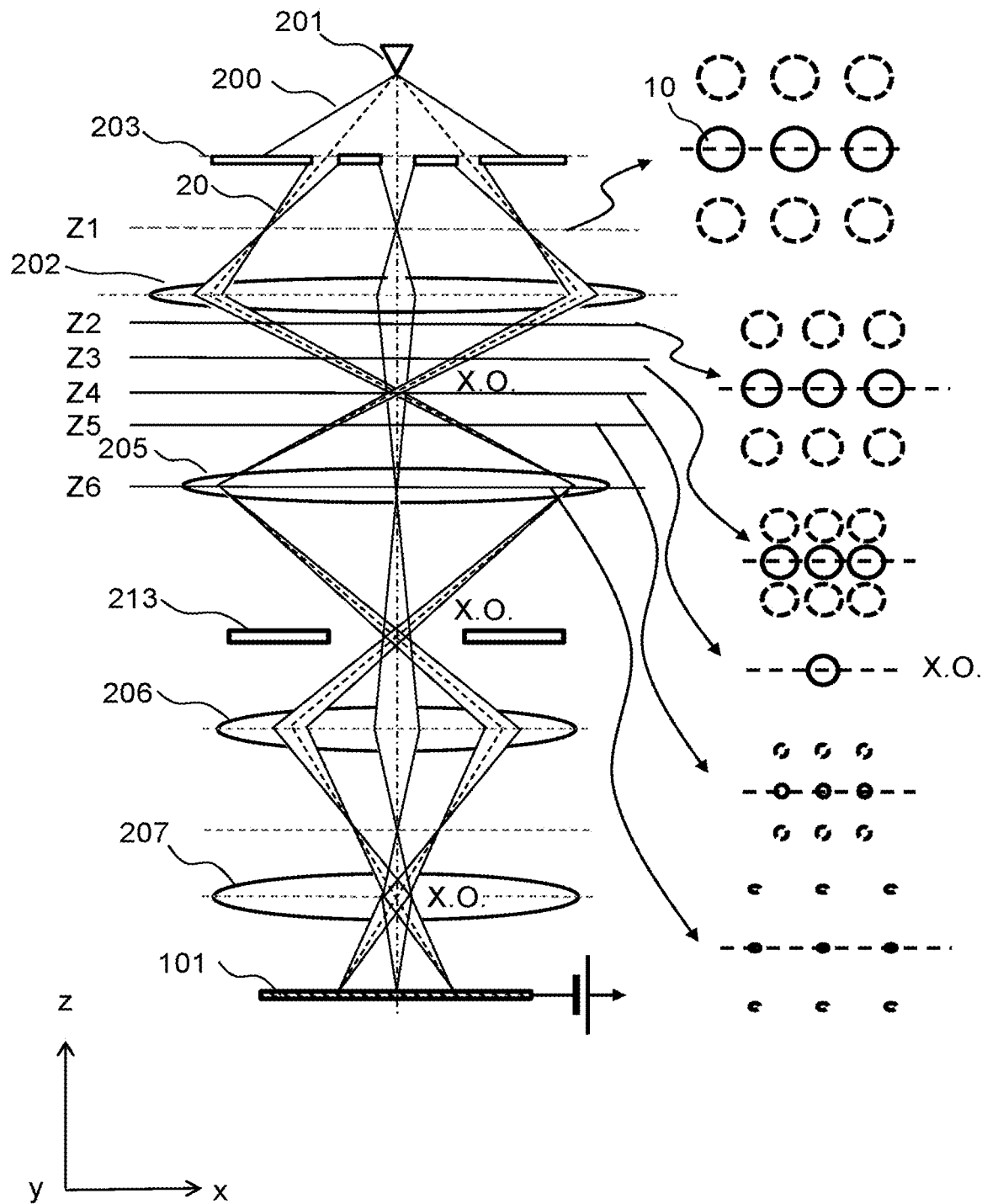
FIG. 4 shows an example of a beam trajectory in the x direction of a primary electron beam array in the x direction according to a comparative example of the first embodiment.

FIG. 4 shows an example of a beam trajectory in the x direction of a primary electron beam array in the x direction according to a comparative example of the first embodiment.

Figure 5:
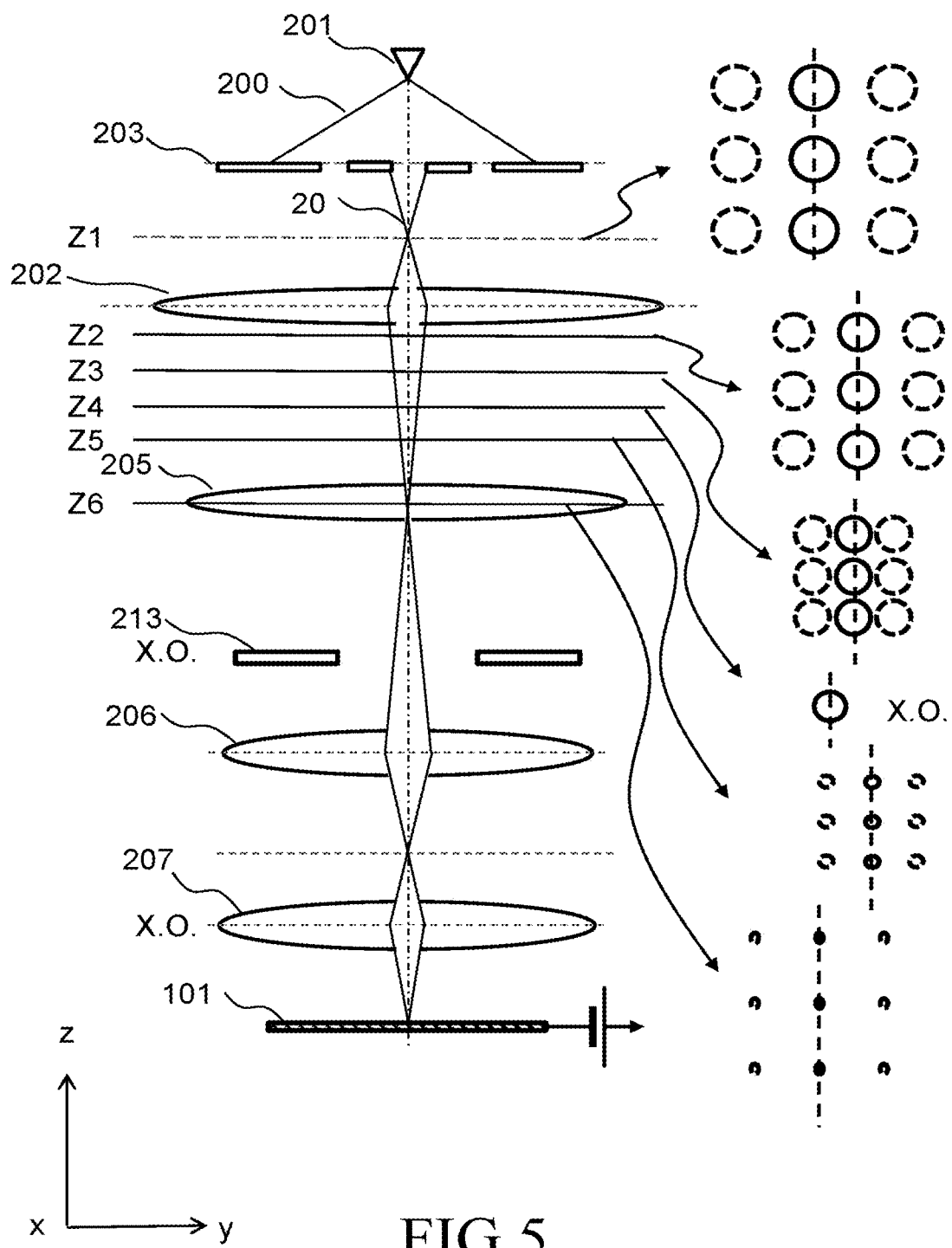
FIG. 5 shows an example of a beam trajectory in the y direction of a primary electron beam array in the x direction according to a comparative example of the first embodiment.

FIG. 5 shows an example of a beam trajectory in the y direction of a primary electron beam array in the x direction according to a comparative example of the first embodiment.

The comparative examples of FIGS. 4 and 5 show examples of the beam trajectory in the case where the multipole deflector array 220 is not arranged. Each of the comparative examples of FIGS. 4 and 5 shows, using the multiple primary electron beams 20 of 3×3, the trajectory of three x-direction primary electron beams, located in the middle row of the rows arrayed in the y direction. Although the image is rotated by a magnetic field, the influence of the magnetic field is ignored in the comparative examples shown in FIGS. 4 and 5 in order to easily understand the difference from the first embodiment. After each primary electron beam 10 forms an intermediate image at the height position Z1, the multiple primary electron beams 20 formed by the shaping aperture array substrate 203 travel to the electromagnetic lens 207 (objective lens) while being individually refracted by the electromagnetic lenses 202, 205 and 206. In this beam trajectory, a crossover (XO) is produced by being individually refracted by the electromagnetic lenses 202, 205, and 206. Each of the examples of FIGS. 4 and 5 shows the first intermediate image at the height position Z1 of the multiple primary electron beams 20 formed by the shaping aperture array substrate 203, and images of the multiple primary electron beams at the height positions Z2, Z3, Z4, Z5, and Z6 between the electromagnetic lenses 202 and 205. As shown in FIG. 4, with respect to the trajectory in the x direction, the multiple primary electron beams 20 refracted by the electromagnetic lens 202 gradually proceed toward the central axis of the trajectory, and form a crossover (XO) on the trajectory center axis at the height position Z4. Also, with respect to the trajectory in the y direction, a crossover (XO) is formed at the height position Z4. Moreover, in the comparative examples shown in FIGS. 4 and 5, a crossover (XO) is formed on the trajectory center axis between the electromagnetic lenses 205 and 206. Similarly, a crossover is formed on the central axis of the trajectory, at the height position of the center of the magnetic field of the electromagnetic lens 207. Thus, in the comparative examples shown in FIGS. 4 and 5, the multiple primary electron beams 20 travel onto the substrate 101 while repeating forming a crossover due to being refracted by the electromagnetic lenses 202, 205 and 206 individually.

Figure 6:
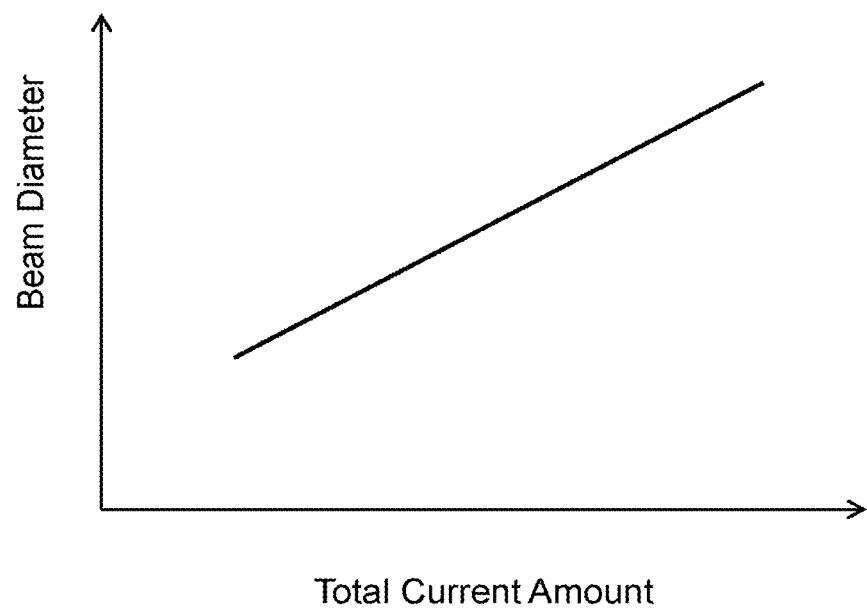
FIG. 6 shows a relation between a total current amount of multiple primary electron beams and a beam diameter of each beam according to the first embodiment.

FIG. 6 shows a relation between a total current amount of multiple primary electron beams and a beam diameter of each beam according to the first embodiment. In FIG. 6, the ordinate axis represents a beam diameter and the abscissa axis represents a total current amount. As shown in FIG. 6, it turns out that as the total current amount of multiple primary electron beams increases, the beam diameter of each beam also increases. This is because, with the increase in the total current amount of the multiple primary electron beams, the Coulomb effect also increases, resulting in blurring of each beam. Thereby, the beam diameter on the substrate becomes large. The Coulomb effect is proportional to the amount of current. Then, the current amount per space becomes maximum at a crossover position where multiple primary electron beams converge. In other words, the total current amount of multiple primary electron beams converges at the crossover position. Therefore, the Coulomb effect largely acts on (affects) the multiple primary electron beams at the crossover position where multiple primary electron beams converge. In addition, the crossover position does not need to be one point, but may be a region where at least portions of multiple primary electron beams overlap with each other in the same plane orthogonal to the direction of the trajectory center axis. According to the first embodiment, the beam trajectory is controlled so that the multiple primary electron beams 20 may not converge on one position. In other words, the beam trajectory is controlled so that the multiple primary electron beams 20 may not form a crossover.

Specifically, the multipole deflector array 220 individually deflects each primary electron beam 10 of the multiple primary electron beams 20 so that they may not converge in the same plane orthogonal to the direction of the trajectory central axis of the multiple primary electron beams 20. In other word, the multipole deflector array 220 individually deflects each beam of the multiple primary electron beams 20 so that a center axis trajectory of each beam of the multiple primary electron beams 20 may not converge in a region of the same plane orthogonal to the direction of a central axis of a trajectory of the multiple primary electron beams 20. A region where multiple primary electron beams overlap with each other in the same plane is included as the region of the same plane. Moreover, in order to reduce the Coulomb effect action as much as possible, it is desirable not to form a crossover during the period from after the multiple primary electron beams 20 are formed to until they reach the substrate 101. Therefore, preferably, after the multiple primary electron beams 20 have been formed, the multipole deflector array 220 is disposed at the upstream side (shaping aperture array substrate 203 side) of the height position Z4 being the first crossover position.

For not forming a crossover by the multiple primary electron beams 20, peripheral beams of the multiple primary electron beams 20 are controlled not to pass through the central axis of the trajectory of the multiple primary electron beams 20. Therefore, the multipole deflector array 220 individually deflects each primary electron beam 10 of the multiple primary electron beams 20 so that peripheral beams, located on the peripheral side off the center, in the multiple primary electron beams 20 may irradiate the substrate 101 without passing through the central axis of the trajectory of the multiple primary electron beams 20. For example, deflection is performed as follows.

Figure 7:
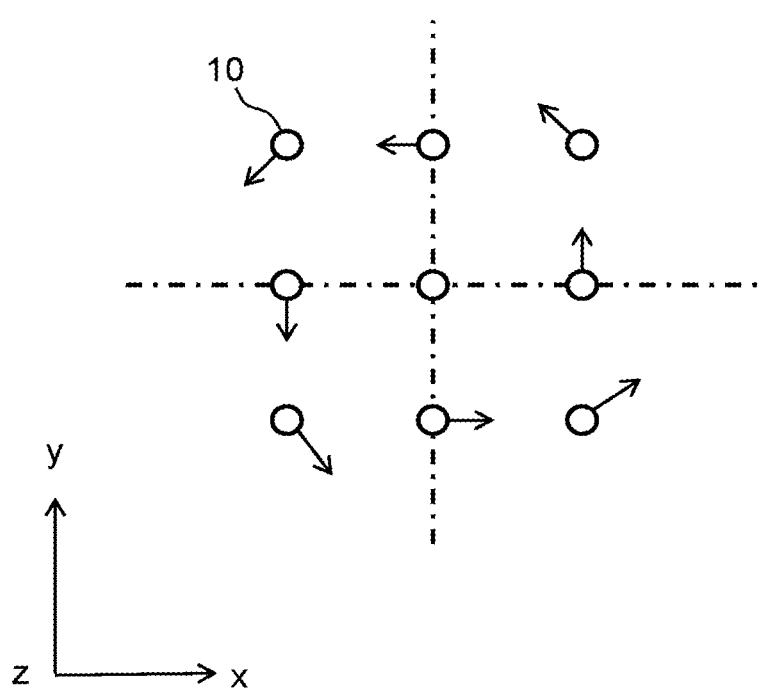
FIG. 7 shows an example of a deflection direction of multiple primary electron beams by a multipole deflector array according to the first embodiment.

FIG. 7 shows an example of a deflection direction of multiple primary electron beams by a multipole deflector array according to the first embodiment. In the example of FIG. 7, the multiple primary electron beams 20 of 3×3 are used, for example. The multipole deflector array 220 controls the deflection direction of each beam of the multiple primary electron beams 20 in such a manner that the deflection direction of each beam is different from that of others, for example. FIG. 7 shows the case where deflection directions of peripheral beams are changed in a counterclockwise direction. Moreover, it is also preferable to control the deflection amount of each beam in such a manner that it may be different from that of others. In the first embodiment, it is not performed to deflect the multiple primary electron beams 20 radially or reverse radially. This is because, even if deflection is performed radially, it only results in that the beam size of the entire multiple primary electron beams 20 increases centering on the trajectory center axis and, after all, the beams 20 converge on one point. Similarly, even if deflection is performed reverse radially, it only results in that the beam size of the entire multiple primary electron beams 20 decreases centering on the trajectory center axis and, after all, the beams 20 converge on one point.

Figure 8:
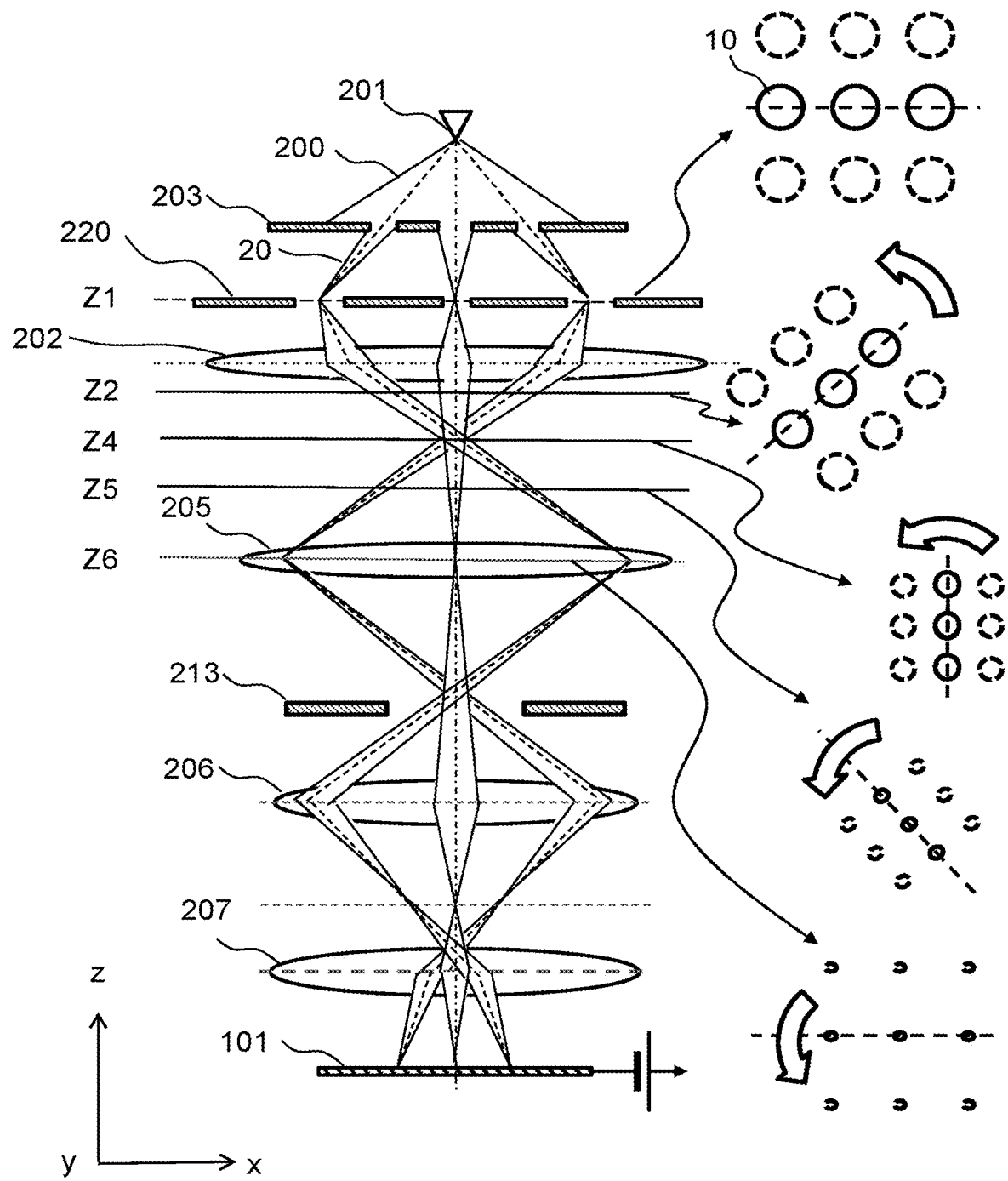
FIG. 8 shows an example of a beam trajectory in the x direction of a primary electron beam array in the x direction according to the first embodiment.

FIG. 8 shows an example of a beam trajectory in the x direction of a primary electron beam array in the x direction according to the first embodiment.

Figure 9:
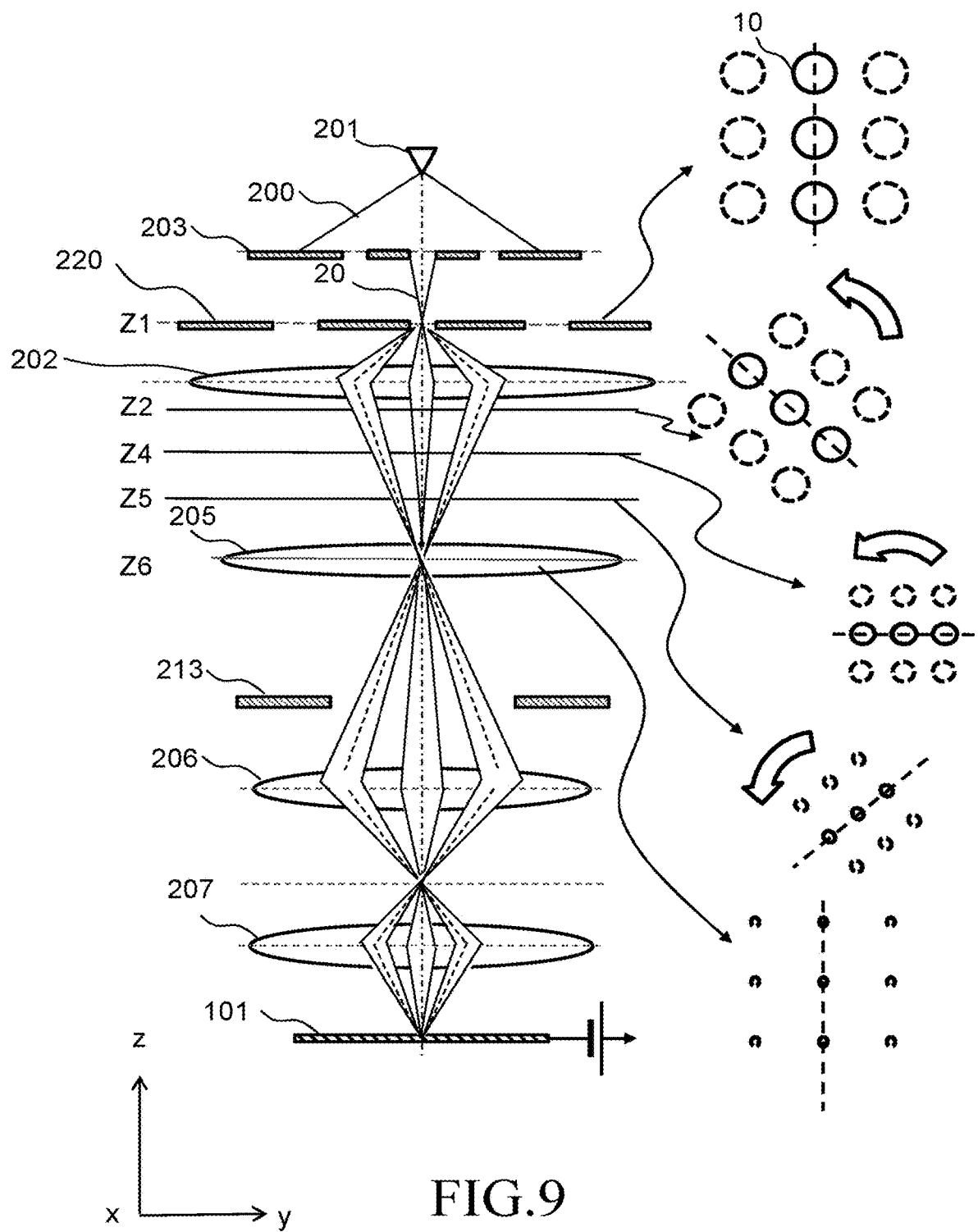
FIG. 9 shows an example of a beam trajectory in the y direction of a primary electron beam array in the x direction according to the first embodiment.

FIG. 9 shows an example of a beam trajectory in the y direction of a primary electron beam array in the x direction according to the first embodiment.

Each of FIGS. 8 and 9 shows, using the multiple primary electron beams 20 of 3×3, the trajectory of three x-direction primary electron beams, located in the middle row of the rows arrayed in the y direction. In the examples of FIGS. 8 and 9, the multipole deflector array 220 is arranged at an intermediate image plane position of the multiple primary electron beams 20. Each of the examples of FIGS. 8 and 9 shows an image rotation due to deflection though that due to the influence of the magnetic field is ignored. Each of the examples of FIGS. 8 and 9 shows an image rotation due to deflection, ignoring that due to an influence of the magnetic field. Since each of the electromagnetic lenses 202, 205, and 206 individually forms an image at a predetermined position due to the nature of the lens, by arranging the multipole deflector array 220 at an intermediate image plane position, it becomes possible to avoid generating position deviation at each subsequent image plane position even if each beam is deflected at that intermediate image plane position. In the example of FIGS. 8 and 9, the multiple primary electron beams 20 formed by the shaping aperture array substrate 203 are individually deflected at the height position Z1 being the first intermediate image plane position of each primary electron beam 10, for each beam, by the multipole deflector array 220 arranged at the height position Z1. In addition, the center beam does not have to be deflected. The multiple primary electron beams 20 having passed through the multipole deflector array 220 are individually refracted by the electromagnetic lenses 202, 205 and 206, and travel to the electromagnetic lens 207 (objective lens) while an image of a beam array of the multiple primary electron beams 20 is rotated. Each of the examples of FIGS. 8 and 9 shows the first intermediate image at the height position Z1 of the multiple primary electron beams 20 formed by the shaping aperture array substrate 203, and images of the multiple primary electron beams at the height positions Z2, Z4, Z5, and Z6 between the electromagnetic lenses 202 and 205. The height position Z3 shown in FIG. 4 is not illustrated. As shown in FIG. 8, with respect to the trajectory in the x direction, though the multiple primary electron beams 20 refracted by the electromagnetic lens 202 gradually proceed toward the central axis of the trajectory, since trajectories of peripheral beams have been corrected by the multipole deflector array 220, a crossover (XO) is not formed on the trajectory center axis at the height position Z4. The same applies to the trajectory in the y direction. Moreover, in the cases of FIGS. 8 and 9, it is also possible to avoid forming a crossover between the electromagnetic lenses 205 and 206, and in the magnetic field of the electromagnetic lens 207. Thus, in the cases of FIGS. 8 and 9, the multiple primary electron beams 20 can travel onto the substrate 101 without forming a crossover even if they are individually refracted by the electromagnetic lenses 202, 205, and 206. In other words, in the primary electron optical system 151, the multiple primary electron beams 20 irradiate the substrate 101 while keeping a state not converged.

Figure 10A:
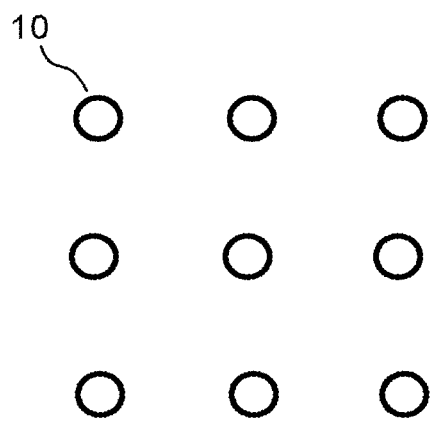
FIGS. 10A and 10B show examples of a beam size on a substrate according to the first embodiment.
Figure 10B:
Figure 10B:
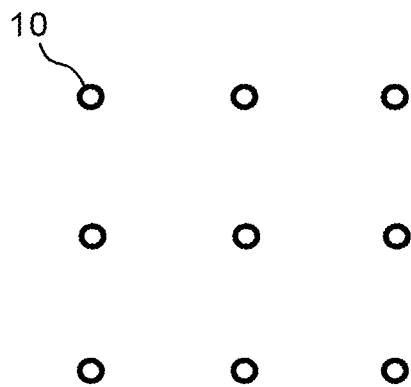

FIGS. 10A and 10B show examples of a beam size on a substrate according to the first embodiment. FIG. 10A shows an example of the beam size of the irradiating multiple primary electron beams 20 on the substrate 101 after forming a crossover. In contrast, according to the first embodiment as shown in FIG. 10B, since, in order not to form a crossover, controlling is performed by correcting trajectories of peripheral beams by the multipole deflector array 220, the beam size of each primary electron beam 10 of the irradiating multiple primary electron beams 20 on the substrate 101 can be reduced compared to the multiple primary electron beams 20 after forming a crossover.

Figure 11A:
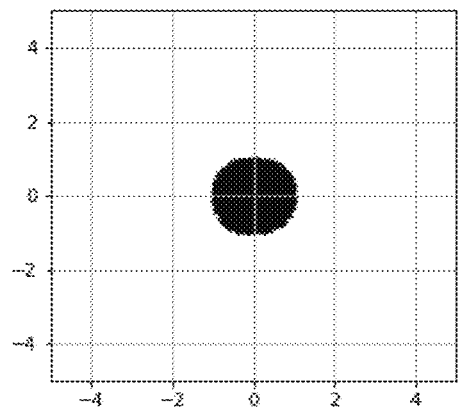
FIGS. 11A to 11C show examples of distance between beams according to the first embodiment.
Figure 11B:
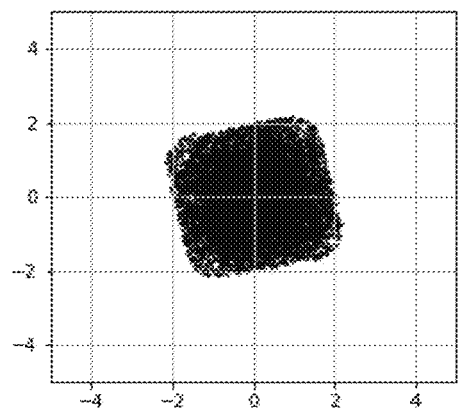
Figure 11C:
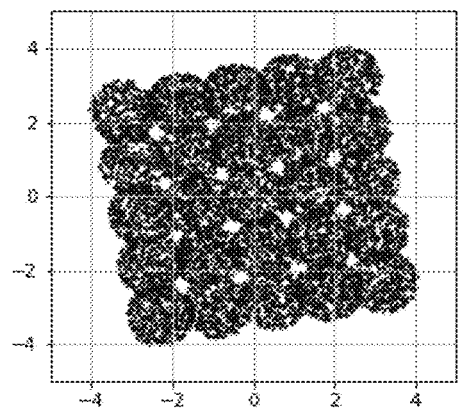

FIGS. 11A to 11C show examples of distance between beams according to the first embodiment. FIG. 11A shows the state where the distance (or length of space) between beams in the crossover plane is 0 (zero). This state shows the distance between beams in the case when a crossover (XO) is formed on the trajectory center axis at the height position Z4 according to the comparative example illustrated in FIGS. 4 and 5. In other words, this state shows the case where the central axis trajectory of each beam of the multiple primary electron beams 20 converges in the plane of the crossover (XO). The distance between beams in the crossover plane can be controlled by individually deflecting each beam by the multipole deflector array 220. FIG. 11B shows the state where the distance between beams is controlled to be 0.4. The case of the distance between beams being 0.4 indicates the state where 40% of adjacent beams do not mutually overlap, but 60% of them overlap with each other. FIG. 11C shows the state where the distance between beams is controlled to be 1.0. The case of the distance between beams being 1.0 indicates the state where peripheral edges of adjacent beams exactly contact with each other, and in other words, where no portion of them overlap with each other. The examples of FIGS. 8 and 9 show the state where, when the multipole deflector array 220 does not deflect each beam, the distance between beams at the height position Z4 on which the central axis trajectory of each beam of the multiple primary electron beams 20 converges is controlled to be a value larger than 1. However, the optimum value is not necessarily this value.

Figure 12:
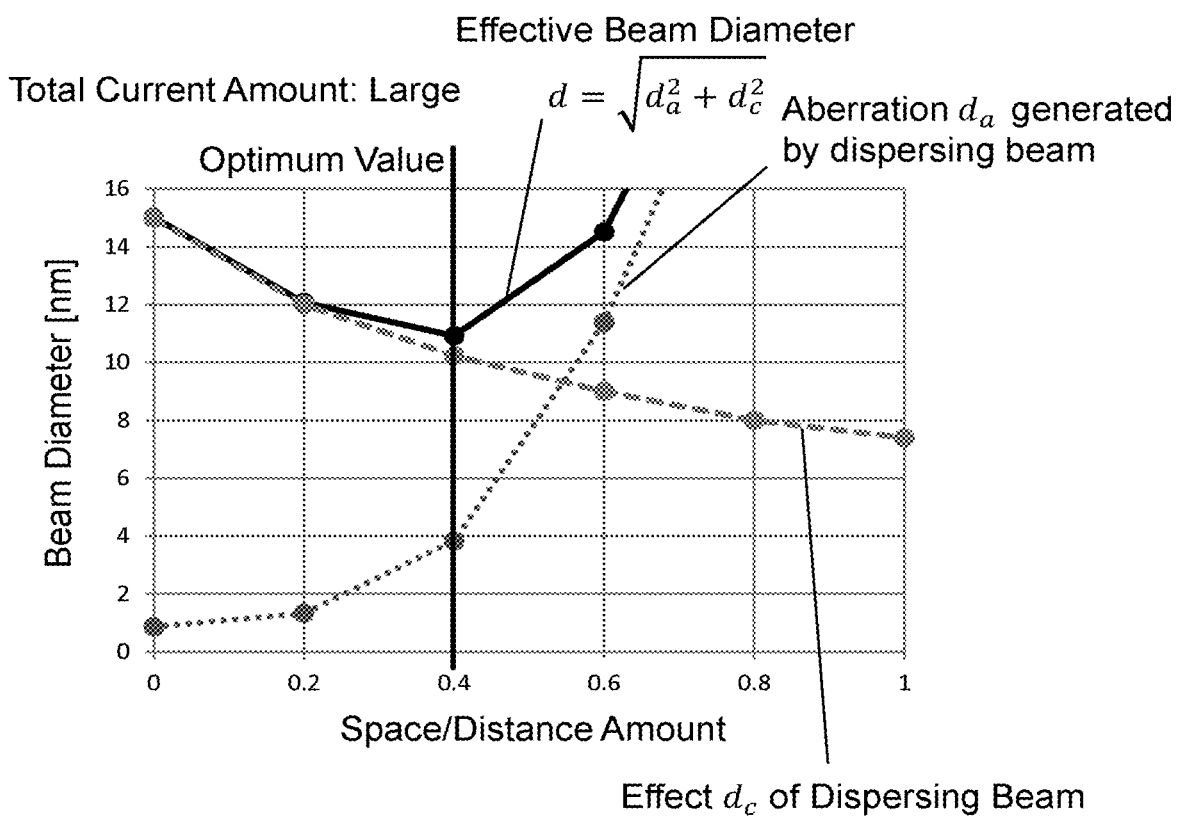
FIG. 12 shows an example of a relation among a beam diameter on a target object surface, an amount of aberration, and a distance between beams in a crossover (XO) plane, according to the first embodiment.

FIG. 12 shows an example of a relation among a beam diameter on a target object surface, an amount of aberration, and a distance between beams in a crossover (XO) plane, according to the first embodiment.

Figure 13:
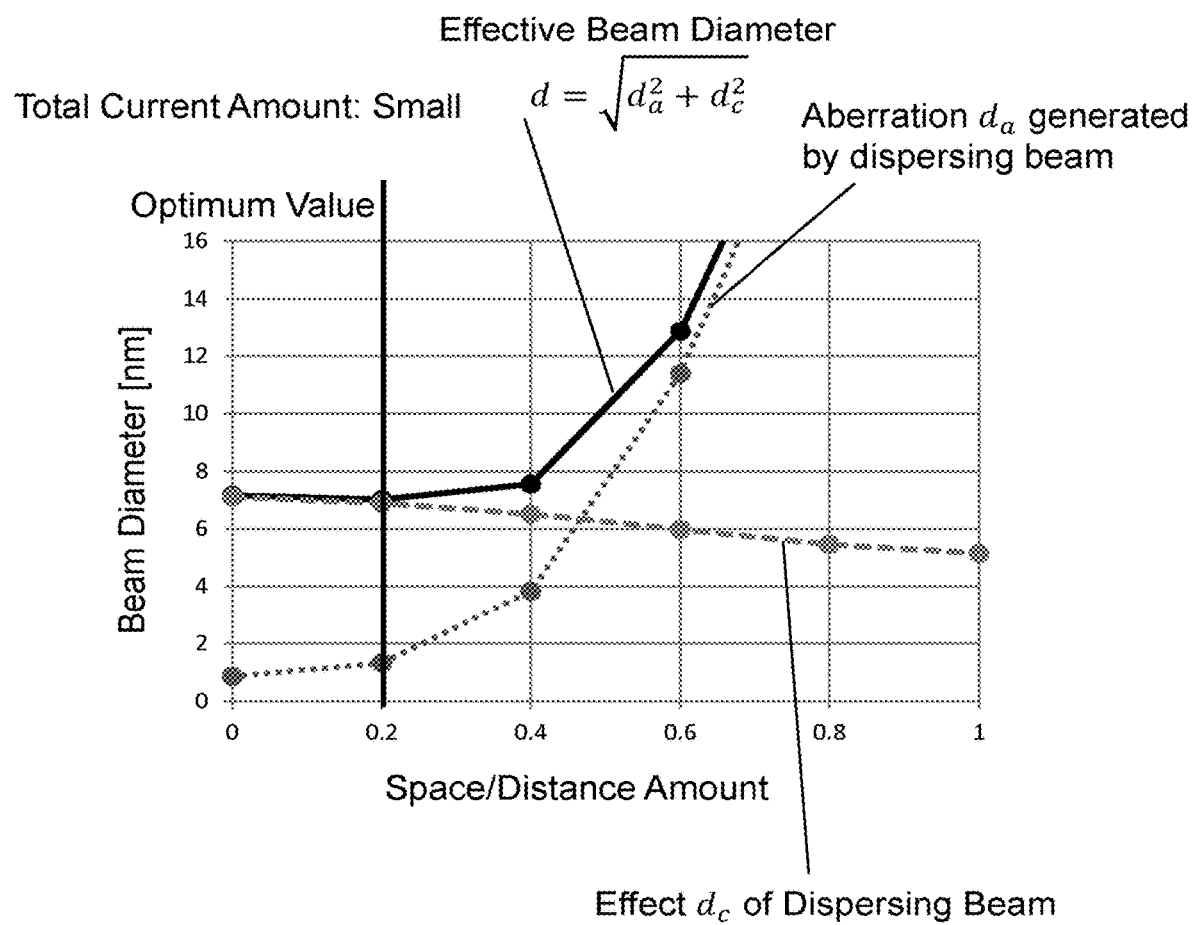
FIG. 13 shows another example of a relation among a beam diameter on a target object surface, an amount of aberration, and a distance between beams in a crossover (XO) plane, according to the first embodiment.

FIG. 13 shows another example of a relation among a beam diameter on a target object surface, an amount of aberration, and a distance between beams in a crossover (XO) plane, according to the first embodiment.

The example of FIG. 12 shows the case where the total current amount of the multiple primary electron beams 20 is large, and the example of FIG. 13 shows the case where that of the multiple primary electron beams 20 is small. In FIGS. 12 and 13, the ordinate axis represents a beam diameter, and the abscissa axis represents a distance between beams. FIGS. 12 and 13 show, as a beam diameter, a beam diameter $d_c$ of each beam of the multiple primary electron beams 20, an aberration amount $d_a$ obtained by substituting a beam diameter for an aberration generated by deflection by the multipole deflector array 220, and an effective beam diameter d on the surface of the substrate 101 including an aberration. The effective beam diameter d can be defined by the square root of the sum of squares of the beam diameter $d_c$ and the aberration amount $d_a$ under the condition of the same distance between beams. As shown in FIGS. 12 and 13, it turns out that the effective beam diameter d does not necessarily become the minimum value just because the distance between beams is large. Moreover, as shown in FIGS. 12 and 13, it turns out that the distance between beams at which the effective beam diameter d becomes minimum changes depending on the total current amount of the multiple primary electron beams 20. Although the distance between beams at which the effective beam diameter d is minimum is an optimum value, it is not limited thereto, and according to the first embodiment, the distance between beams is controlled to be the one at which the effective beam diameter d is smaller than or equal to a threshold value. For example, it is preferable to set the threshold value to allow errors of 10% of the minimum value of the effective beam diameter d. Then, the multipole deflector array 220 deflects each beam individually so that the beam diameter d including aberration of each beam may be smaller than or equal to the threshold value. In that case, the deflection amount of each beam is adjusted so that the distance between beams at the height position Z4 may be a value which makes the beam diameter on the surface of the substrate 101 be smaller than or equal to the threshold value, where the height position Z4 is the one on which the central axis trajectory of each beam of the multiple primary electron beams 20 converges when each beam is not deflected by the multipole deflector array 220.

Figure 14:
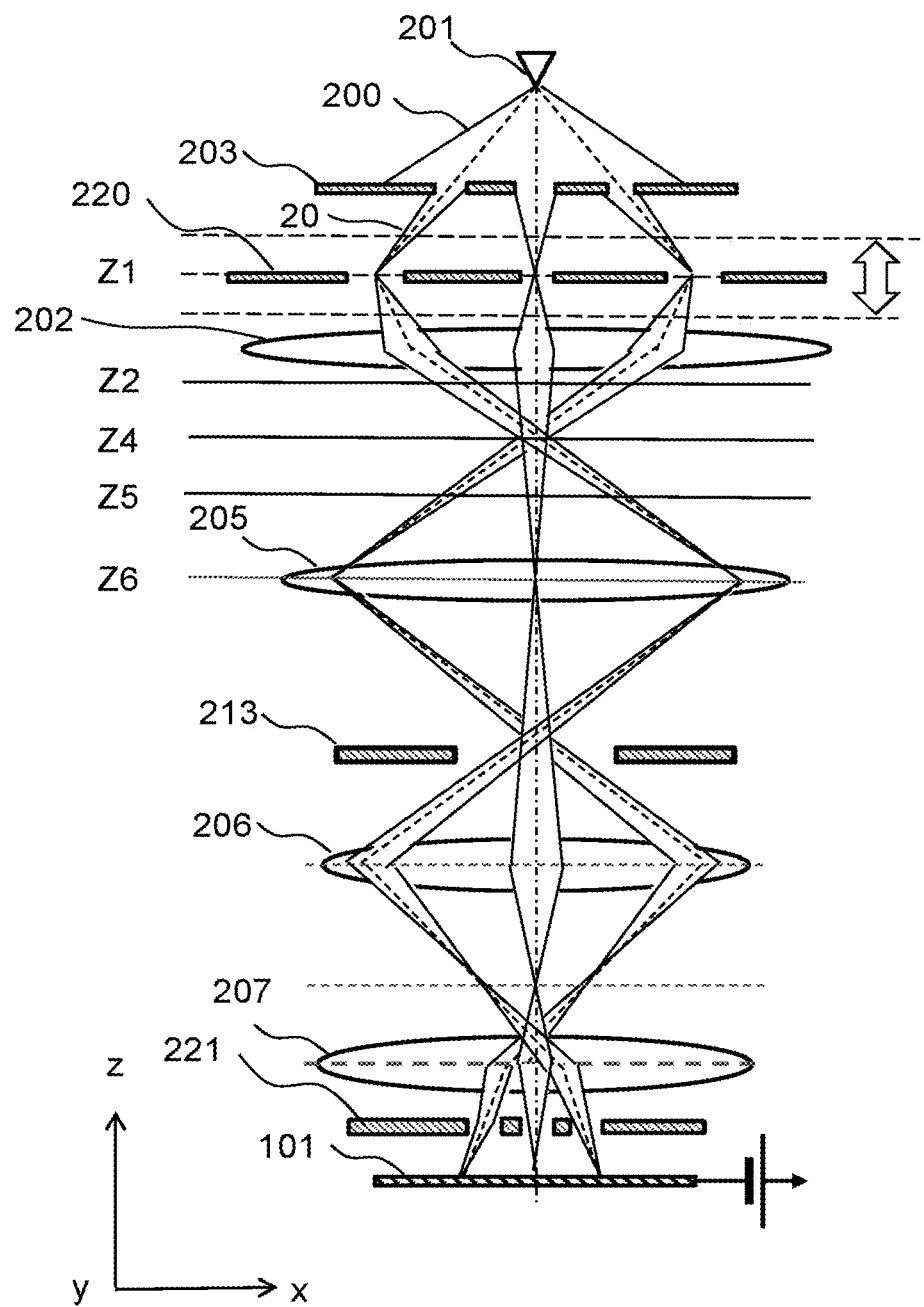
FIG. 14 shows an example of a beam trajectory in the x direction of a primary electron beam array in the x direction according to a modified example of the first embodiment.

FIG. 14 shows an example of a beam trajectory in the x direction of a primary electron beam array in the x direction according to a modified example of the first embodiment. Although, in the example of FIG. 8, the multipole deflector array 220 is arranged at the intermediate image plane position (Z1), it is not limited thereto. In the example of FIG. 14, the multipole deflector array 220 is arranged at a height position displaced from the intermediate image plane position (Z1). In that case, positions of beams deviate from the image plane position on the subsequent trajectory. Therefore, according to the modified example of the first embodiment, with respect to each primary electron beam 10 of the multiple primary electron beams 20 having passed through the multipole deflector array 220 (the first multipole deflector array), a multipole deflector array 221 (the second multipole deflector array) is further disposed for individually deflecting each primary electron beam 10 of the multiple primary electron beams 20. For example, it is preferable to dispose the multipole deflector array 221 between the last electromagnetic lens 207 (objective lens) and the substrate 101. By providing, by the multipole deflector array 221, deflection individually for each primary electron beam 10 whose position has been deviated, a desired position on the substrate 101 can be irradiated with each primary electron beam 10.

Alternatively, it is also preferable that the multipole deflector array 221 is used for astigmatism correction. When the multipole deflector array 220 individually deflects each beam, astigmatism may occur in the beam. Therefore, it is also preferable to use the multipole deflector array 221 so that it can individually correct astigmatism of each primary electron beam 10.

Figure 15:
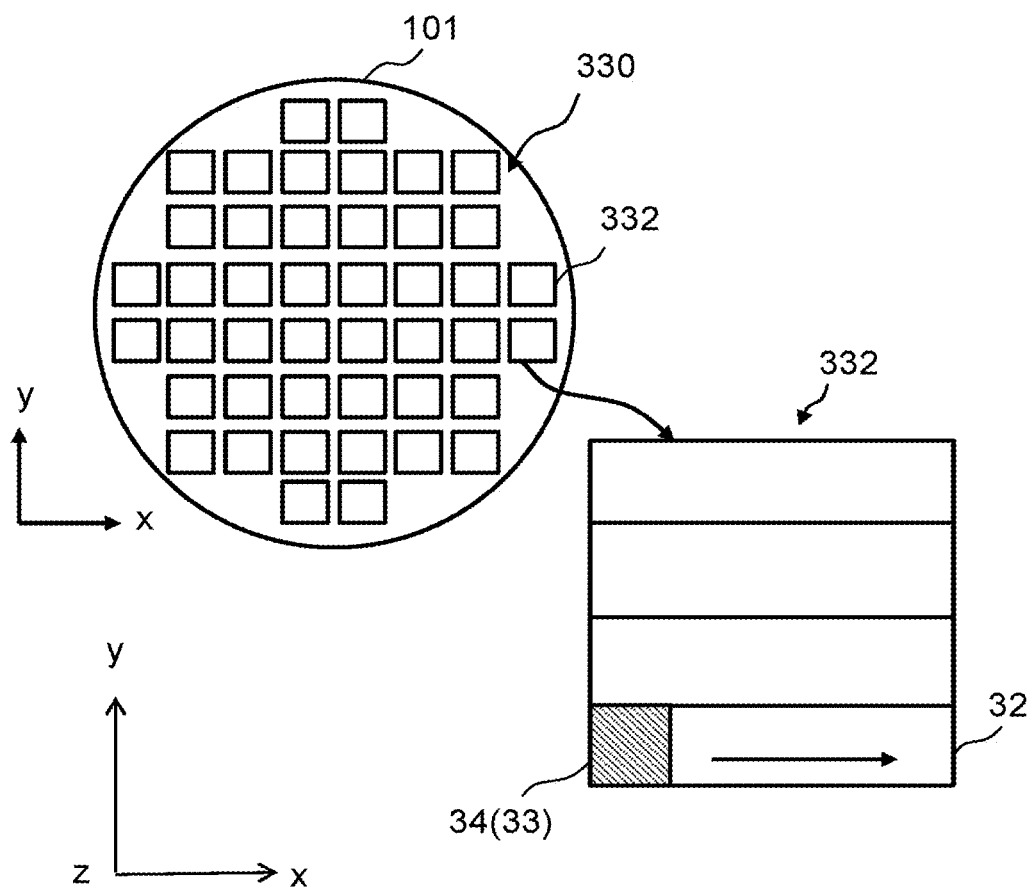
FIG. 15 shows an example of a plurality of chip regions formed on a semiconductor substrate according to the first embodiment.

FIG. 15 shows an example of a plurality of chip regions formed on a semiconductor substrate according to the first embodiment. In FIG. 15, in the case of the substrate 101 being a semiconductor substrate (wafer), a plurality of chips (wafer dies) 332 in a two-dimensional array are formed in an inspection region 330 of the semiconductor substrate (wafer). A mask pattern for one chip formed on an exposure mask substrate is reduced to, for example, ¼, and exposed/transferred onto each chip 332 by an exposure device (stepper) (not shown). Generally, a mask pattern for one chip is composed of a plurality of figure patterns. For example, the region of each chip 332 is divided in the y direction into a plurality of stripe regions 32 by a predetermined width. Scanning operations by the image acquisition mechanism 150 are performed for each stripe region 32, for example. The operation of scanning the stripe region 32 advances relatively in the x direction while the stage 105 is being moved in the −x direction, for example. Each stripe region 32 is divided in the longitudinal direction into a plurality of rectangular (including square) regions 33. Beam application to a target rectangular region 33 is achieved by collectively deflecting all the multiple primary electron beams 20 by the main deflector 208.

Figure 16:
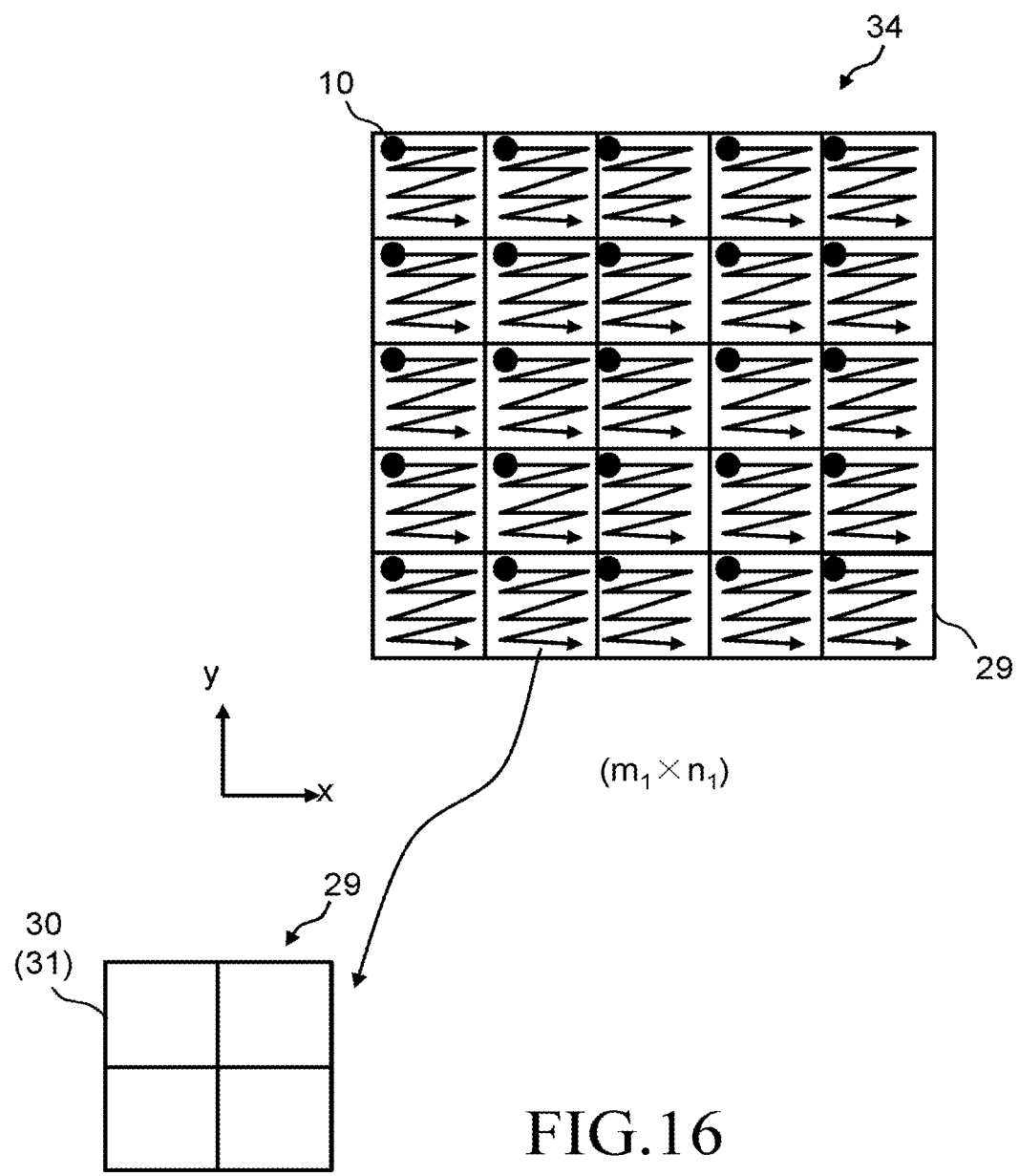
FIG. 16 illustrates an operation of scanning using multiple primary electron beams according to the first embodiment.

FIG. 16 illustrates an operation of scanning using multiple primary electron beams according to the first embodiment. FIG. 16 shows the case of the multiple primary electron beams 20 of 5×5 (5 rows by 5 columns). The size of an irradiation region 34 which can be irradiated by one irradiation with the multiple primary electron beams 20 is defined by (x direction size obtained by multiplying a beam pitch in the x direction of the multiple primary electron beams 20 on the substrate 101 by the number of beams in the x direction)×(y direction size obtained by multiplying a beam pitch in the y direction of the multiple primary electron beams 20 on the substrate 101 by the number of beams in the y direction). Each primary electron beam 10 of the multiple primary electron beams 20 scans the inside of a sub-irradiation region 29 concerned, surrounded by the beam pitch in the x direction and the beam pitch in the y direction, where the beam concerned itself is located. Each primary electron beam 10 is associated with any one of the sub-irradiation regions 29 which are different from each other. At the time of each shot, each primary electron beam 10 is applied to the same position in the associated sub-irradiation region 29. The primary electron beam 10 is moved in the sub-irradiation region 29 by collective deflection of all the multiple primary electron beams 20 by the sub deflector 209. By repeating this operation, the inside of one sub-irradiation region 29 is irradiated, in order, with one primary electron beam 10.

When desired positions on the substrate 101 are irradiated with the multiple primary electron beams 20, a flux of secondary electrons (multiple secondary electron beams 300) including reflected electrons each corresponding to each of the multiple primary electron beams 20 is emitted from the substrate 101 due to the irradiation by the multiple primary electron beams 20.

The multiple secondary electron beams 300 emitted from the substrate 101 travel to the beam separator 214 through the electromagnetic lens 207.

It is preferable to use, for example, an E×B separator as the beam separator 214. The beam separator (E×B separator) 214 includes a plurality of, at least two, electrodes (poles) which generate an electric field, and a plurality of, at least two, magnetic poles which generate a magnetic field, where each magnetic pole has a coil. There is at least a pair of opposite electrodes in the plurality of electrodes. There is at least a pair of opposite magnetic poles in the plurality of magnetic poles. The beam separator 214 generates an electric field and a magnetic field to be perpendicular to each other in a plane orthogonal to the traveling direction of the center beam, that is the direction of the trajectory center axis, of the multiple primary electron beams 20. The electric field affects (exerts a force) in the same fixed direction regardless of the traveling direction of electrons. In contrast, the magnetic field affects (exerts a force) according to Fleming's left-hand rule. Therefore, the direction of force acting on (applied to) electrons can be changed depending on the traveling (or "entering") direction of the electrons. With respect to the multiple primary electron beams 20 entering the beam separator 214 from the upper side, since the force due to the electric field and the force due to the magnetic field cancel each other out, the beams 20 travel straight downward. In contrast, with respect to the multiple secondary electron beams 300 entering the beam separator 214 from the lower side, since both the force due to the electric field and the force due to the magnetic field are exerted in the same direction, the beams 300 are bent obliquely upward, and separated from the multiple primary electron beams 20.

The multiple secondary electron beams 300 bent obliquely upward and separated from the multiple primary electron beams 20 are further bent by the deflector 218, and projected, while being refracted, onto the multi-detector 222 by the electromagnetic lens 224. The multi-detector 222 detects the projected multiple secondary electron beams 300. The multi-detector 222 includes, for example, a diode type two-dimensional sensor (not shown). Then, at the position of a diode type two-dimensional sensor corresponding to each beam of the multiple primary electron beams 20, each secondary electron of the multiple secondary electron beams 300 collides with the diode type two-dimensional sensor, so that electrons are generated and secondary electron image data for each pixel is produced. An intensity signal detected by the multi-detector 222 is output to the detection circuit 106.

When the substrate 101 is irradiated with the multiple primary electron beams 20 while the stage 105 is continuously moving, the main deflector 208 executes a tracking operation by performing collective deflection so that the irradiation position of the multiple primary electron beams 20 may follow the movement of the stage 105. Therefore, the emission position of the multiple secondary electron beams 300 changes every second with respect to the central axis of the trajectory of the multiple primary electron beams 20. Similarly, when the inside of the sub-irradiation region 29 is scanned, the emission position of each secondary electron beam changes every second in the sub-irradiation region 29. The deflector 218 collectively deflects the multiple secondary electron beams 300 in order that each secondary electron beam whose emission position has changed as described above may be applied to a corresponding detection region of the multi-detector 222.

For acquiring a secondary electron image, as described above, the multiple primary electron beams 20 are applied to the substrate 101, and then, the multi-detector 222 detects the multiple secondary electron beams 300, including reflected electrons, emitted from the substrate 101 due to the irradiation with the multiple primary electron beams 20. Detected data (measured image data: secondary electron image data: inspection image data) on a secondary electron of each pixel in each sub-irradiation region 29 detected by the multi-detector 222 is output to the detection circuit 106 in order of measurement. In the detection circuit 106, the detected data in analog form is converted into digital data by an A-D converter (not shown), and stored in the chip pattern memory 123. Then, the acquired secondary electron image data (data of secondary electron image 1) is output to the comparison circuit 108 together with information on each position from the position circuit 107.

Preferably, the width of each stripe region 32 described above is set to be the same as the size in the y direction of the irradiation region 34, or to be the size reduced by the width of the scanning margin. In the case of FIG. 15, the irradiation region 34 and the rectangular region 33 are of the same size. However, it is not limited thereto. The irradiation region 34 may be smaller than the rectangular region 33, or larger than it. Then, when scanning of one sub-irradiation region 29 is completed, the irradiation position is moved to an adjacent rectangular region 33 in the same stripe region 32 by collective deflection of all the multiple primary electron beams 20 by the main deflector 208. By repeating this operation, the inside of the stripe region 32 is irradiated in order. When scanning of one stripe region 32 has been completed, the irradiation region 34 is moved to the next stripe region 32 by moving the stage 105 and/or by collectively deflecting all the multiple primary electron beams 20 by the main deflector 208. As described above, the scanning of each sub-irradiation region 29 and acquiring a secondary electron image are performed by the irradiation with each primary electron beam 10. A secondary electron image of the rectangular region 33, a secondary electron image of the stripe region 32, or a secondary electron image of the chip 332 is configured by combining secondary electron images of respective sub-irradiation regions 29. When an image comparison is actually performed, as shown in FIG. 16, for example, the sub-irradiation region 29 in each rectangular region 33 is further divided into a plurality of frame regions 30, and a frame image 31 of each frame region 30 is to be compared.

The comparison circuit 108 (inspection unit, inspection circuit) inspects a secondary electron image based on the detected multiple secondary electron beams 300. The case of comparing image data defined by a gray scale level and the like each other will be described. However, it is not limited thereto. It is also preferable, for example, to extract a contour (outline) of a figure pattern from a secondary electron image, and compare the distance between the extracted contour and a reference contour.

Figure 17:
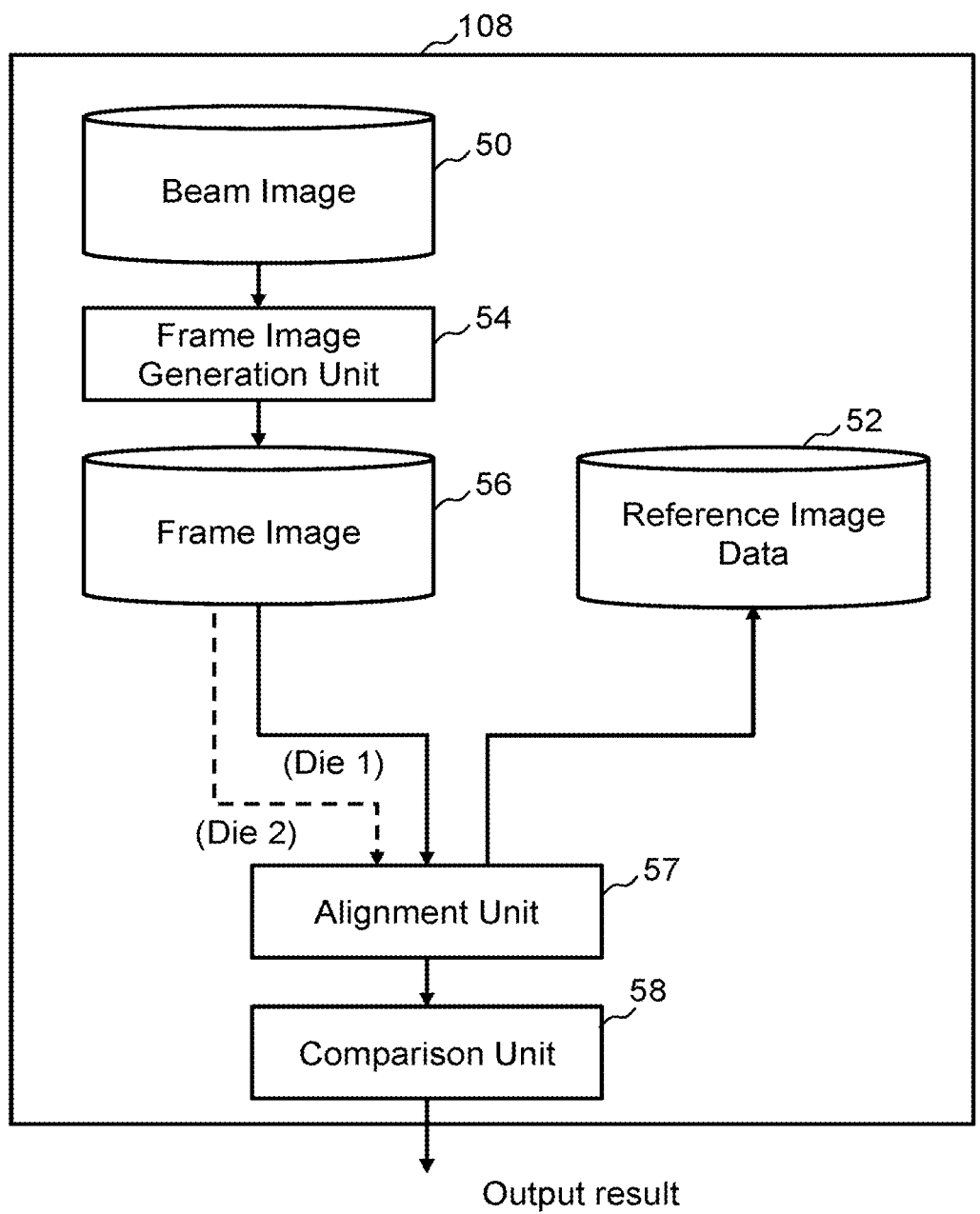
FIG. 17 shows an example of an internal configuration of a comparison circuit according to the first embodiment.

FIG. 17 shows an example of an internal configuration of a comparison circuit according to the first embodiment. In FIG. 17, in the comparison circuit 108, there are arranged storage devices 50, 52 and 56, such as magnetic disk drives, a frame image generation unit 54, an alignment unit 57, and a comparison unit 58. Each of the "units" such as the frame image generation unit 54, the alignment unit 57, and the comparison unit 58 includes processing circuitry. As the processing circuitry, for example, an electric circuit, computer, processor, circuit board, quantum circuit, semiconductor device, or the like can be used. Each of the "units" may use common processing circuitry (the same processing circuitry), or different processing circuitry (separate processing circuitry). Input data needed in the frame image generation unit 54, the alignment unit 57 and the comparison unit 58, and calculated results are stored in a memory (not shown) or in the memory 118 each time.

The measured image data (beam image) transmitted into the comparison circuit 108 is stored in the storage device 50.

Then, the frame image generation unit 54 generates a frame image 31 of each of a plurality of frame regions 30 obtained by further dividing image data of the sub-irradiation region 29 acquired by scanning using each primary electron beam 10. In order to prevent missing an image, it is preferable that margin regions overlap each other in each frame region 30. The generated frame image 31 is stored in the storage device 56.

The reference image generation circuit 112 generates, for each frame region 30, a reference image corresponding to the frame image 31, based on design data serving as a basis of a plurality of figure patterns formed on the substrate 101. Specifically, it operates as follows: First, design pattern data is read from the storage device 109 through the control computer 110, and each figure pattern defined by the read design pattern data is converted into image data of binary or multiple values.

Basic figures defined by the design pattern data are, for example, rectangles and triangles. For example, there is stored figure data defining the shape, size, position, and the like of each pattern figure by using information, such as coordinates (x, y) of the reference position of the figure, lengths of sides of the figure, and a figure code serving as an identifier for identifying the figure type such as a rectangle, a triangle and the like.

When design pattern data serving as the figure data is input to the reference image generation circuit 112, the data is developed into data of each figure. A figure code, figure dimensions, and the like indicating the figure shape of each figure data are interpreted. Then, the reference image generation circuit 112 develops each figure data to design pattern image data of binary or multiple values as a pattern to be arranged in squares in units of grids of predetermined quantization dimensions, and outputs the developed data. In other words, the reference image generation circuit 112 reads design data, calculates the occupancy of a figure in the design pattern, for each square region obtained by virtually dividing the inspection region into squares in units of predetermined dimensions, and outputs n-bit occupancy data. For example, it is preferable to set one square as one pixel. Assuming that one pixel has a resolution of $1/2^8(=1/256)$, the occupancy in each pixel is calculated by allocating small regions which correspond to the region of figures arranged in the pixel concerned and each of which corresponds to 1/256 resolution. Then, the occupancy is generated as 8-bit occupancy data. Such square regions (inspection pixels) can be corresponding to (matched with) pixels of measured data.

Next, the reference image generation circuit 112 performs filtering processing on design image data of a design pattern which is image data of a figure, using a predetermined filter function. Thereby, it is possible to match/fit the design image data being image data on the design side, whose image intensity (gray scale level) is represented by digital values, with image generation characteristics obtained by irradiation with the multiple primary electron beams 20. The generated image data for each pixel of a reference image is output to the comparison circuit 108. The reference image data transmitted into the comparison circuit 108 is stored in the storage device 52.

Next, the alignment unit 57 reads a frame image 31 serving as an inspection image, and a reference image corresponding to the frame image 31, and provides alignment between both the images, based on units of sub-pixels smaller than units of pixels. For example, the alignment can be performed by a least-square method.

Then, the comparison unit 58 compares, for each pixel, the frame image 31 and the reference image. The comparison unit 58 compares them, for each pixel, based on predetermined determination conditions in order to determine whether there is a defect such as a shape defect. For example, if a gray scale level difference of each pixel is larger than a determination threshold Th, it is determined that there is a defect. Then, the comparison result is output. It may be output specifically to the storage device 109, the monitor 117, or the memory 118, or alternatively, output from the printer 119.

In the examples described above, the die-to-database inspection is performed. However, it is not limited thereto. A die-to-die inspection may be performed. In the case of the die-to-die inspection, alignment and comparison having been described above are carried out between the frame image 31 (die 1) to be inspected and another frame image 31 (die 2) (another example of a reference image) in which there is formed the same pattern as that of the frame image 31 to be inspected.

As described above, according to the first embodiment, the Coulomb effect which affects the multiple primary electron beams 20 can be reduced. Therefore, it becomes possible to increase the total current amount of the multiple primary electron beams 20 while inhibiting increase in the beam size. Thus, irradiation with the multiple primary electron beams 20 of high resolution and high throughput can be realized.

In the above description, each " . . . circuit" includes processing circuitry. As the processing circuitry, for example, an electric circuit, computer, processor, circuit board, quantum circuit, semiconductor device, or the like can be used. Each " . . . circuit" may use common processing circuitry (the same processing circuitry), or different processing circuitry (separate processing circuitry). A program for causing a processor to execute processing or the like may be stored in a recording medium, such as a magnetic disk drive, magnetic tape drive, FD, ROM (Read Only Memory), etc. For example, the position circuit 107, the comparison circuit 108, the reference image generation circuit 112, the stage control circuit 114, the deflector array control circuit 121, the lens control circuit 124, the blanking control circuit 126, the deflection control circuit 128, and the retarding potential application circuit 170 may be configured by at least one processing circuit described above. For example, processing in these circuits may be carried out by the control computer 110.

Embodiments have been explained referring to specific examples described above. However, the present invention is not limited to these specific examples. Although FIG. 1 shows the case where the multiple primary electron beams 20 are formed by the shaping aperture array substrate 203 irradiated with one beam from the electron gun 201 serving as an irradiation source, it is not limited thereto. The multiple primary electron beams 20 may be formed by irradiation with a primary electron beam from each of a plurality of irradiation sources.

While the apparatus configuration, control method, and the like not directly necessary for explaining the present invention are not described, some or all of them can be appropriately selected and used on a case-by-case basis when needed.

In addition, any other multi-charged particle beam irradiation apparatus, multi-charged particle beam inspection apparatus and methods for them that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multi-charged particle beam irradiation apparatus comprising:
   a forming mechanism configured to form multiple charged particle beams;
   a multipole deflector array configured to individually deflect each beam of the multiple charged particle beams so that a center axis trajectory of the each beam of the multiple charged particle beams does not converge in a region of a same plane orthogonal to a direction of a central axis of a trajectory of the multiple charged particle beams; and
   an electron optical system configured to irradiate a substrate with the multiple charged particle beams while maintaining a state where the multiple charged particle beams are not converged.

2. The apparatus according to claim 1, wherein the multipole deflector array is configured to individually deflect the each beam of the multiple charged particle beams so that a peripheral beam, located on a peripheral side off a center, in the multiple charged particle beams irradiates the substrate without passing through the central axis of the trajectory of the multiple charged particle beams.

3. The apparatus according to claim 1, wherein the multipole deflector array is arranged at an intermediate image plane position of the multiple charged particle beams.

4. The apparatus according to claim 1, further comprising:
   a second multipole deflector array, in a case of defining the multipole deflector array as a first multipole deflector array, configured to individually deflect the each beam of the multiple charged particle beams having passed through the first multipole deflector array.

5. The apparatus according to claim 1, further comprising:
   a second multipole deflector array, in a case of defining the multipole deflector array as a first multipole deflector array, configured to individually correct astigmatism of the each beam of the multiple charged particle beams having passed through the first multipole deflector array.

6. The apparatus according to claim 1, wherein the multipole deflector array is configured to individually deflect the each beam so that a beam diameter including aberration of the each beam is smaller than or equal to a threshold value.

7. The apparatus according to claim 6, wherein the multipole deflector array is configured to adjust a deflection amount of the each beam such that a distance between beams at a position, on which the center axis trajectory of the each beam of the multiple charged particle beams converges in a case where the each beam is not deflected by the multipole deflector array, is a value making the beam diameter on a surface of the substrate be smaller than or equal to the threshold value.

8. The apparatus according to claim 1, wherein the electron optical system comprises at least one of an electromagnetic lens, a deflector and an aperture.

9. A multi-charged particle beam inspection apparatus comprising:
   a forming mechanism configured to form multiple charged particle beams;
   a multipole deflector array configured to individually deflect each beam of the multiple charged particle beams so that a center axis trajectory of the each beam of the multiple charged particle beams does not converge in a region of a same plane orthogonal to a direction of a central axis of a trajectory of the multiple charged particle beams;
   an electron optical system configured to irradiate a substrate with the multiple charged particle beams while maintaining a state where the multiple charged particle beams are not converged;
   a multi-detector configured to detect multiple secondary electron beams emitted from the substrate due to irradiation with the multiple charged particle beams; and
   a comparison circuit configured to inspect a secondary electron image based on detected multiple secondary electron beams.

10. The apparatus according to claim 9, wherein the multipole deflector array is configured to individually deflect the each beam of the multiple charged particle beams so that a peripheral beam, located on a peripheral side off a center, in the multiple charged particle beams irradiates the substrate without passing through the central axis of the trajectory of the multiple charged particle beams.

11. The apparatus according to claim 9, wherein the multipole deflector array is arranged at an intermediate image plane position of the multiple charged particle beams.

12. The apparatus according to claim 9, further comprising:
   a second multipole deflector array, in a case of defining the multipole deflector array as a first multipole deflector array, configured to individually deflect the each beam of the multiple charged particle beams having passed through the first multipole deflector array.

13. The apparatus according to claim 9, further comprising:
   a second multipole deflector array, in a case of defining the multipole deflector array as a first multipole deflector array, configured to individually correct astigmatism of the each beam of the multiple charged particle beams having passed through the first multipole deflector array.

14. The apparatus according to claim 9, wherein the electron optical system comprises at least one of an electromagnetic lens, a deflector and an aperture.

* * * * *